US012580477B2

(12) United States Patent
Gertiser et al.

(10) Patent No.: US 12,580,477 B2
(45) Date of Patent: Mar. 17, 2026

(54) SYSTEMS AND METHODS FOR ACTIVE AND PASSIVE COOLING OF ELECTRICAL COMPONENTS

(71) Applicant: BorgWarner US Technologies LLC, Wilmington, DE (US)

(72) Inventors: Kevin M. Gertiser, Carmel, IN (US); Chris Fruth, Kokomo, IN (US)

(73) Assignee: BorgWarner US Technologies LLC, Wilmington, DE (US)

( * ) Notice: Subject to any disclaimer, the term of this patent is extended or adjusted under 35 U.S.C. 154(b) by 410 days.

(21) Appl. No.: 18/162,468

(22) Filed: Jan. 31, 2023

(65) Prior Publication Data

US 2024/0105553 A1 Mar. 28, 2024

Related U.S. Application Data

(60) Provisional application No. 63/378,601, filed on Oct. 6, 2022, provisional application No. 63/377,486, filed (Continued)

(51) Int. Cl.
*H01L 21/48* (2006.01)
*H01L 23/367* (2006.01)
(Continued)

(52) U.S. Cl.
CPC ..... *H05K 7/20927* (2013.01); *H01L 21/4882* (2013.01); *H01L 23/3675* (2013.01);
(Continued)

(58) Field of Classification Search
CPC ............. H01L 23/4338; H01L 23/4006; H01L 23/49565; H01L 23/544; H01L 21/4882;
(Continued)

(56) References Cited

U.S. PATENT DOCUMENTS 4,054,828 A 10/1977 Conzelmann et al.
4,128,801 A 12/1978 Gansert et al.
(Continued)

FOREIGN PATENT DOCUMENTS

DE 102017222350 A1 6/2018
DE 102021200016 A1 8/2021
(Continued)

OTHER PUBLICATIONS

Maniar, K., et al., "Addressing High-voltage Design Challenges With Reliable and Affordable Isolation Technologies," 2024, pp. 1-12. Retrieved from internet URL: https://www.ti.com/lit/wp/slyy204c/slyy204c.pdf ts=1710508127616&ref_url=https%253A%252F%252Fwww.google.com%252F.
(Continued)

*Primary Examiner* — Jarrett J Stark
(74) *Attorney, Agent, or Firm* — Joshua M. Hines; BookoffMcAndrews, PLLC

(57) ABSTRACT
A method for mounting a fin system in a power module includes: sintering a fin system to a first base substrate, the fin system comprising a plurality of fins attached to and extending away from a base plate; sintering a first power switch component to the first base substrate; sintering a second power switch component to a second base substrate; and soldering a heat dissipation element to the second base substrate.

11 Claims, 12 Drawing Sheets

Related U.S. Application Data on Sep. 28, 2022, provisional application No. 63/377,512, filed on Sep. 28, 2022, provisional application No. 63/377,501, filed on Sep. 28, 2022.

(51) Int. Cl.

| | |
|---|---|
| *H01L 23/40* | (2006.01) |
| *H01L 23/467* | (2006.01) |
| *H01L 23/495* | (2006.01) |
| *H02M 1/00* | (2006.01) |
| *H05K 7/20* | (2006.01) |
| *B60L 3/00* | (2019.01) |
| *B60L 15/00* | (2006.01) |
| *B60L 15/08* | (2006.01) |
| *B60L 15/20* | (2006.01) |
| *B60L 50/40* | (2019.01) |
| *B60L 50/51* | (2019.01) |
| *B60L 50/60* | (2019.01) |
| *B60L 50/64* | (2019.01) |
| *B60L 53/20* | (2019.01) |
| *B60L 53/22* | (2019.01) |
| *B60L 53/62* | (2019.01) |
| *B60R 16/02* | (2006.01) |
| *G01R 15/20* | (2006.01) |
| *G06F 1/08* | (2006.01) |
| *G06F 13/40* | (2006.01) |
| *H01L 23/00* | (2006.01) |
| *H01L 23/15* | (2006.01) |
| *H01L 23/373* | (2006.01) |
| *H01L 23/473* | (2006.01) |
| *H01L 23/538* | (2006.01) |
| *H01L 25/00* | (2006.01) |
| *H01L 25/07* | (2006.01) |
| *H02J 7/00* | (2006.01) |
| *H02M 1/08* | (2006.01) |
| *H02M 1/084* | (2006.01) |
| *H02M 1/088* | (2006.01) |
| *H02M 1/12* | (2006.01) |
| *H02M 1/32* | (2007.01) |
| *H02M 1/42* | (2007.01) |
| *H02M 1/44* | (2007.01) |
| *H02M 3/335* | (2006.01) |
| *H02M 7/00* | (2006.01) |
| *H02M 7/537* | (2006.01) |
| *H02M 7/5387* | (2007.01) |
| *H02M 7/5395* | (2006.01) |
| *H02P 27/06* | (2006.01) |
| *H02P 27/08* | (2006.01) |
| *H02P 29/024* | (2016.01) |
| *H02P 29/68* | (2016.01) |
| *H03K 19/20* | (2006.01) |
| *H05K 1/14* | (2006.01) |
| *H05K 1/181* | (2026.01) |
| *H05K 1/182* | (2026.01) |
| *H05K 5/02* | (2006.01) |
| *H10D 64/01* | (2025.01) |

(52) U.S. Cl.
CPC ........ *H01L 23/4006* (2013.01); *H01L 23/467* (2013.01); *H01L 23/49562* (2013.01); *H02M 1/0054* (2021.05); *H05K 7/20154* (2013.01); *H05K 7/20254* (2013.01); *H05K 7/2049* (2013.01); *H05K 7/20854* (2013.01); *H05K 7/209* (2013.01); *B60L 3/003* (2013.01); *B60L 15/007* (2013.01); *B60L 15/08* (2013.01); *B60L 15/20* (2013.01); *B60L 50/40* (2019.02);

*B60L 50/51* (2019.02); *B60L 50/60* (2019.02); *B60L 50/64* (2019.02); *B60L 53/20* (2019.02); *B60L 53/22* (2019.02); *B60L 53/62* (2019.02); *B60L 2210/30* (2013.01); *B60L 2210/40* (2013.01); *B60L 2210/42* (2013.01); *B60L 2210/44* (2013.01); *B60L 2240/36* (2013.01); *B60R 16/02* (2013.01); *G01R 15/20* (2013.01); *G06F 1/08* (2013.01); *G06F 13/4004* (2013.01); *G06F 2213/40* (2013.01); *H01L 23/15* (2013.01); *H01L 23/3672* (2013.01); *H01L 23/3735* (2013.01); *H01L 2023/405* (2013.01); *H01L 2023/4087* (2013.01); *H01L 23/473* (2013.01); *H01L 23/5383* (2013.01); *H01L 24/32* (2013.01); *H01L 24/33* (2013.01); *H01L 25/072* (2013.01); *H01L 25/50* (2013.01); *H01L 2224/32225* (2013.01); *H01L 2224/32245* (2013.01); *H01L 2224/33181* (2013.01); *H02J 7/0063* (2013.01); *H02J 2207/20* (2020.01); *H02M 1/0009* (2021.05); *H02M 1/08* (2013.01); *H02M 1/084* (2013.01); *H02M 1/088* (2013.01); *H02M 1/123* (2021.05); *H02M 1/32* (2013.01); *H02M 1/322* (2021.05); *H02M 1/327* (2021.05); *H02M 1/4258* (2013.01); *H02M 1/44* (2013.01); *H02M 3/33523* (2013.01); *H02M 7/003* (2013.01); *H02M 7/537* (2013.01); *H02M 7/5387* (2013.01); *H02M 7/53871* (2013.01); *H02M 7/53875* (2013.01); *H02M 7/5395* (2013.01); *H02P 27/06* (2013.01); *H02P 27/08* (2013.01); *H02P 27/085* (2013.01); *H02P 29/024* (2013.01); *H02P 29/027* (2013.01); *H02P 29/68* (2016.02); *H02P 2207/05* (2013.01); *H03K 19/20* (2013.01); *H05K 1/145* (2013.01); *H05K 1/181* (2013.01); *H05K 1/182* (2013.01); *H05K 5/0247* (2013.01); *H05K 7/2039* (2013.01); *H05K 2201/042* (2013.01); *H05K 2201/10166* (2013.01); *H10D 64/018* (2025.01)

(58) Field of Classification Search
CPC ................. H01L 25/072; H01L 23/473; H01L 23/49541; H01L 25/18; H01L 23/40
See application file for complete search history.

(56) References Cited

U.S. PATENT DOCUMENTS

| | | | |
|---|---|---|---|
| 4,564,771 A | 1/1986 | Flohrs | |
| 4,618,875 A | 10/1986 | Flohrs | |
| 4,716,304 A | 12/1987 | Fiebig et al. | |
| 5,068,703 A | 11/1991 | Conzelmann et al. | |
| 5,426,565 A | 6/1995 | Anderson | |
| 5,432,371 A | 7/1995 | Denner et al. | |
| 5,559,661 A | 9/1996 | Meinders | |
| 5,654,863 A | 8/1997 | Davies | |
| 5,764,007 A | 6/1998 | Jones | |
| 5,841,312 A | 11/1998 | Mindl et al. | |
| 6,028,470 A | 2/2000 | Michel et al. | |
| 6,163,138 A | 12/2000 | Kohl et al. | |
| 6,351,173 B1 | 2/2002 | Ovens et al. | |
| 6,397,935 B1 | 6/2002 | Yamamoto et al. | |
| 6,414,867 B2 | 7/2002 | Suzuki et al. | |
| 6,426,857 B1 | 7/2002 | Doster et al. | |
| 6,442,023 B2 | 8/2002 | Cettour-Rose et al. | |
| 6,597,556 B1 | 7/2003 | Michel et al. | |
| 6,721,181 B1 | 4/2004 | Pfeifer et al. | |
| 6,812,553 B2 | 11/2004 | Gerbsch et al. | |
| 6,943,293 B1 | 9/2005 | Jeter et al. | |
| 7,095,098 B2 | 8/2006 | Gerbsch et al. | |
| 7,215,545 B1 | 5/2007 | Moghaddam et al. | |

(56) References Cited

U.S. PATENT DOCUMENTS

| | | | |
|---|---|---|---|
| 7,229,855 B2 | 6/2007 | Murphy | |
| 7,295,433 B2 | 11/2007 | Taylor et al. | |
| 7,459,954 B2 | 12/2008 | Kuehner et al. | |
| 7,538,425 B2 | 5/2009 | Myers et al. | |
| 7,551,439 B2 | 6/2009 | Peugh et al. | |
| 7,616,047 B2 | 11/2009 | Rees et al. | |
| 7,724,046 B2 | 5/2010 | Wendt et al. | |
| 7,750,720 B2 | 7/2010 | Dittrich | |
| 9,088,159 B2 | 7/2015 | Peuser | |
| 9,275,915 B2 | 3/2016 | Heinisch et al. | |
| 9,373,970 B2 | 6/2016 | Feuerstack et al. | |
| 9,431,932 B2 | 8/2016 | Schmidt et al. | |
| 9,515,584 B2 | 12/2016 | Koller et al. | |
| 9,548,675 B2 | 1/2017 | Schoenknecht | |
| 9,806,607 B2 | 10/2017 | Ranmuthu et al. | |
| 9,843,320 B2 | 12/2017 | Richter et al. | |
| 9,871,444 B2 | 1/2018 | Ni et al. | |
| 9,882,490 B2 | 1/2018 | Veeramreddi et al. | |
| 9,941,234 B2* | 4/2018 | Liang | H01L 24/33 |
| 10,111,285 B2 | 10/2018 | Shi et al. | |
| 10,116,300 B2 | 10/2018 | Blasco et al. | |
| 10,232,718 B2 | 3/2019 | Trunk et al. | |
| 10,270,354 B1 | 4/2019 | Lu et al. | |
| 10,291,225 B2 | 5/2019 | Li et al. | |
| 10,525,847 B2 | 1/2020 | Strobel et al. | |
| 10,797,579 B2 | 10/2020 | Hashim et al. | |
| 10,924,001 B2 | 2/2021 | Li et al. | |
| 11,082,052 B2 | 8/2021 | Jang et al. | |
| 11,108,389 B2 | 8/2021 | Li et al. | |
| 11,342,911 B2 | 5/2022 | Lee et al. | |
| 11,749,580 B2 | 9/2023 | Ruppert | |
| 11,838,011 B2 | 12/2023 | Li et al. | |
| 11,843,320 B2 | 12/2023 | Sivakumar et al. | |
| 11,848,426 B2 | 12/2023 | Zhang et al. | |
| 11,851,038 B2 | 12/2023 | Solanki et al. | |
| 11,855,522 B2 | 12/2023 | Rudolph et al. | |
| 11,855,630 B2 | 12/2023 | Dake et al. | |
| 11,870,338 B1 | 1/2024 | Narayanasamy | |
| 11,872,997 B2 | 1/2024 | Hoos et al. | |
| 11,881,859 B2 | 1/2024 | Gupta et al. | |
| 11,888,391 B2 | 1/2024 | Balasubramanian et al. | |
| 11,888,393 B2 | 1/2024 | Venkateswaran et al. | |
| 11,901,803 B2 | 2/2024 | Ruck et al. | |
| 11,901,881 B1 | 2/2024 | Narayanasamy | |
| 11,909,319 B2 | 2/2024 | Esteghlal et al. | |
| 11,916,426 B2 | 2/2024 | Oner et al. | |
| 11,923,762 B2 | 3/2024 | Sethumadhavan et al. | |
| 11,923,764 B1 | 3/2024 | Zhang | |
| 11,923,799 B2 | 3/2024 | Ojha et al. | |
| 11,925,119 B2 | 3/2024 | Male et al. | |
| 11,927,624 B2 | 3/2024 | Patel et al. | |
| 11,938,838 B2 | 3/2024 | Simonis et al. | |
| 11,942,927 B2 | 3/2024 | Purcarea et al. | |
| 11,942,934 B2 | 3/2024 | Ritter | |
| 11,945,331 B2 | 4/2024 | Blemberg et al. | |
| 11,945,522 B2 | 4/2024 | Matsumura et al. | |
| 11,949,320 B2 | 4/2024 | Jaladanki et al. | |
| 11,949,333 B2 | 4/2024 | Pahkala et al. | |
| 11,955,896 B2 | 4/2024 | Liu et al. | |
| 11,955,953 B2 | 4/2024 | Sinn et al. | |
| 11,955,964 B2 | 4/2024 | Agarwal et al. | |
| 11,962,234 B2 | 4/2024 | Narayanasamy et al. | |
| 11,962,291 B2 | 4/2024 | Oberdieck et al. | |
| 11,964,587 B2 | 4/2024 | Yukawa | |
| 11,970,076 B2 | 4/2024 | Sarfert et al. | |
| 11,977,404 B2 | 5/2024 | Chandrasekaran | |
| 11,984,802 B2 | 5/2024 | Merkin et al. | |
| 11,984,876 B2 | 5/2024 | Neidorff et al. | |
| 11,990,776 B2 | 5/2024 | Dulle | |
| 11,990,777 B2 | 5/2024 | Woll et al. | |
| 11,996,686 B2 | 5/2024 | Chan et al. | |
| 11,996,699 B2 | 5/2024 | Vasconcelos Araujo et al. | |
| 11,996,714 B2 | 5/2024 | El Markhi et al. | |
| 11,996,715 B2 | 5/2024 | Nandi et al. | |
| 11,996,762 B2 | 5/2024 | Hembach et al. | |
| 11,996,830 B2 | 5/2024 | Murthy et al. | |
| 11,996,847 B1 | 5/2024 | Kazama et al. | |
| 12,003,191 B2 | 6/2024 | Chaudhary et al. | |
| 12,003,229 B2 | 6/2024 | Kaya et al. | |
| 12,003,237 B2 | 6/2024 | Waters | |
| 12,008,847 B2 | 6/2024 | Braun et al. | |
| 12,009,679 B2 | 6/2024 | Gottwald et al. | |
| 12,012,057 B2 | 6/2024 | Schneider et al. | |
| 12,015,342 B2 | 6/2024 | Kienzler et al. | |
| 12,019,112 B2 | 6/2024 | Jarmolowitz et al. | |
| 12,021,517 B2 | 6/2024 | S et al. | |
| 12,120,857 B2 | 10/2024 | Siewert et al. | |
| 2006/0050483 A1 | 3/2006 | Wilson et al. | |
| 2006/0067054 A1 | 3/2006 | Wang et al. | |
| 2007/0236883 A1 | 10/2007 | Ruiz | |
| 2013/0114210 A1 | 5/2013 | Ebersberger et al. | |
| 2016/0290727 A1 | 10/2016 | Coteus et al. | |
| 2016/0293518 A1 | 10/2016 | Gohara et al. | |
| 2016/0351468 A1* | 12/2016 | Liang | H01L 24/33 |
| 2017/0331469 A1 | 11/2017 | Kilb et al. | |
| 2018/0145007 A1 | 5/2018 | Hatano et al. | |
| 2020/0195121 A1 | 6/2020 | Keskar et al. | |
| 2021/0005711 A1 | 1/2021 | Martinez-Limia et al. | |
| 2022/0052610 A1 | 2/2022 | Plum | |
| 2022/0149752 A1 | 5/2022 | Trenz et al. | |
| 2022/0294441 A1 | 9/2022 | Purcarea et al. | |
| 2023/0010616 A1 | 1/2023 | Gschwantner et al. | |
| 2023/0061922 A1 | 3/2023 | Ritter | |
| 2023/0082076 A1 | 3/2023 | Strache et al. | |
| 2023/0126070 A1 | 4/2023 | Oberdieck et al. | |
| 2023/0179198 A1 | 6/2023 | Winkler | |
| 2023/0231210 A1 | 7/2023 | Joos et al. | |
| 2023/0231400 A1 | 7/2023 | Oberdieck et al. | |
| 2023/0231496 A1 | 7/2023 | Syed et al. | |
| 2023/0238808 A1 | 7/2023 | Swoboda et al. | |
| 2023/0268826 A1 | 8/2023 | Yan et al. | |
| 2023/0335509 A1 | 10/2023 | Poddar | |
| 2023/0365086 A1 | 11/2023 | Schumacher et al. | |
| 2023/0370062 A1 | 11/2023 | Wolf | |
| 2023/0378022 A1 | 11/2023 | Kim et al. | |
| 2023/0380103 A1* | 11/2023 | Catuneanu | H01L 23/4093 |
| 2023/0386963 A1 | 11/2023 | Kim et al. | |
| 2023/0402930 A1 | 12/2023 | Corry et al. | |
| 2023/0420968 A1 | 12/2023 | Oner et al. | |
| 2023/0421049 A1 | 12/2023 | Neidorff | |
| 2024/0006869 A1 | 1/2024 | Kim et al. | |
| 2024/0006899 A1 | 1/2024 | Wernerus | |
| 2024/0006993 A1 | 1/2024 | Barjati et al. | |
| 2024/0022187 A1 | 1/2024 | Fassnacht | |
| 2024/0022240 A1 | 1/2024 | Balaz | |
| 2024/0022244 A1 | 1/2024 | S et al. | |
| 2024/0030730 A1 | 1/2024 | Wernerus | |
| 2024/0039062 A1 | 2/2024 | Wernerus | |
| 2024/0039402 A1 | 2/2024 | Bafna et al. | |
| 2024/0039406 A1 | 2/2024 | Chen et al. | |
| 2024/0048048 A1 | 2/2024 | Zhang | |
| 2024/0055488 A1 | 2/2024 | Lee et al. | |
| 2024/0067116 A1 | 2/2024 | Qiu | |
| 2024/0072675 A1 | 2/2024 | Formenti et al. | |
| 2024/0072817 A1 | 2/2024 | K et al. | |
| 2024/0077899 A1 | 3/2024 | Chitnis et al. | |
| 2024/0078204 A1 | 3/2024 | Roehrle et al. | |
| 2024/0079950 A1 | 3/2024 | Narayanasamy | |
| 2024/0079958 A1 | 3/2024 | Kumar et al. | |
| 2024/0080028 A1 | 3/2024 | Dake et al. | |
| 2024/0088647 A1 | 3/2024 | Ramadass et al. | |
| 2024/0088896 A1 | 3/2024 | Bilhan et al. | |
| 2024/0097437 A1 | 3/2024 | Goyal et al. | |
| 2024/0097459 A1 | 3/2024 | Swoboda et al. | |
| 2024/0105276 A1 | 3/2024 | Duryea | |
| 2024/0106248 A1 | 3/2024 | Woll et al. | |
| 2024/0106435 A1 | 3/2024 | Zhang et al. | |
| 2024/0113517 A1 | 4/2024 | Sriraj et al. | |
| 2024/0113611 A1 | 4/2024 | Kaufmann et al. | |
| 2024/0113620 A1 | 4/2024 | Ranmuthu et al. | |
| 2024/0113624 A1 | 4/2024 | Southard et al. | |
| 2024/0120255 A1 | 4/2024 | Truessel et al. | |
| 2024/0120558 A1 | 4/2024 | Zhang et al. | |
| 2024/0120765 A1 | 4/2024 | Oner et al. | |

(56) References Cited

U.S. PATENT DOCUMENTS

| | | |
|---|---|---|
| 2024/0120962 A1 | 4/2024 | Miriyala et al. |
| 2024/0128851 A1 | 4/2024 | Ruck et al. |
| 2024/0128859 A1 | 4/2024 | Chen |
| 2024/0128867 A1 | 4/2024 | Wang et al. |
| 2024/0146177 A1 | 5/2024 | Mehdi et al. |
| 2024/0146306 A1 | 5/2024 | Ramkaj et al. |
| 2024/0149734 A1 | 5/2024 | Eisenlauer |
| 2024/0162723 A1 | 5/2024 | Zipf et al. |
| 2024/0178756 A1 | 5/2024 | El-Markhi et al. |
| 2024/0178824 A1 | 5/2024 | Kazama et al. |
| 2024/0186803 A1 | 6/2024 | Krieg et al. |
| 2024/0198937 A1 | 6/2024 | Benqassmi et al. |
| 2024/0198938 A1 | 6/2024 | Carlos et al. |
| 2024/0204540 A1 | 6/2024 | Majmunovic et al. |
| 2024/0204541 A1 | 6/2024 | Majmunovic et al. |
| 2024/0204671 A1 | 6/2024 | Liu et al. |
| 2024/0204765 A1 | 6/2024 | Dake |
| 2024/0213874 A1 | 6/2024 | Junnarkar et al. |
| 2024/0213971 A1 | 6/2024 | Lee |
| 2024/0213975 A1 | 6/2024 | Narayanasamy |
| 2024/0213981 A1 | 6/2024 | Agarwal et al. |
| 2024/0215211 A1 | 6/2024 | Matsuoka et al. |
| 2024/0282663 A1 | 8/2024 | Im et al. |

FOREIGN PATENT DOCUMENTS

| | | |
|---|---|---|
| WO | 2007093598 A1 | 8/2007 |
| WO | 2019034505 A1 | 2/2019 |
| WO | 2020156820 A1 | 8/2020 |
| WO | 2020239797 A1 | 12/2020 |
| WO | 2021110405 A1 | 6/2021 |
| WO | 2021213728 A1 | 10/2021 |
| WO | 2022012943 A1 | 1/2022 |
| WO | 2022229149 A1 | 11/2022 |
| WO | 2023006491 A1 | 2/2023 |
| WO | 2023046607 A1 | 3/2023 |
| WO | 2023094053 A1 | 6/2023 |
| WO | 2023110991 A1 | 6/2023 |
| WO | 2023147907 A1 | 8/2023 |
| WO | 2023151850 A1 | 8/2023 |
| WO | 2023227278 A1 | 11/2023 |
| WO | 2023237248 A1 | 12/2023 |
| WO | 2024006181 A2 | 1/2024 |
| WO | 2024012743 A1 | 1/2024 |
| WO | 2024012744 A1 | 1/2024 |
| WO | 2024022219 A1 | 2/2024 |
| WO | 2024041776 A1 | 2/2024 |
| WO | 2024046614 A1 | 3/2024 |
| WO | 2024049730 A1 | 3/2024 |
| WO | 2024049884 A1 | 3/2024 |
| WO | 2024049909 A1 | 3/2024 |
| WO | 2024056388 A1 | 3/2024 |
| WO | 2024068065 A1 | 4/2024 |
| WO | 2024068076 A1 | 4/2024 |
| WO | 2024068113 A1 | 4/2024 |
| WO | 2024068115 A1 | 4/2024 |
| WO | 2024083391 A1 | 4/2024 |
| WO | 2024093384 A1 | 5/2024 |
| WO | 2024104970 A1 | 5/2024 |
| WO | 2024108401 A1 | 5/2024 |
| WO | 2024110106 A1 | 5/2024 |
| WO | 2024110265 A1 | 5/2024 |
| WO | 2024110297 A1 | 5/2024 |
| WO | 2024114978 A1 | 6/2024 |
| WO | 2024114979 A1 | 6/2024 |
| WO | 2024114980 A1 | 6/2024 |
| WO | 2024128286 A1 | 6/2024 |
| WO | 2024132249 A1 | 6/2024 |

OTHER PUBLICATIONS

"New products," 5 Pages, Retrieved from internet URL:https://www.ti.com/product-category/new-products.html?%20releasePeriod=364#releasePeriod=90.

"Qualcomm and Bosch Showcase New Central Vehicle Computer for Digital Cockpit and Driver Assistance Functions at CES 2024," 2024, 8 Pages. Retrieved from internet URL:https://www.qualcomm.com/news/releases/2024/01/qualcomm-and-bosch-showcase-new-central-vehicle-computer-for-dig.

Ackermann Roland R.: "The Next Step: Sintering is the Key to Future Power Systems", Bodo's Power Systems, Jul. 1, 2019 (Jul. 1, 2019), pp. 20-23, XP093111847, <<https://www.heraeus.com/media/media/het/media_het/products_and_solutions_3/sintering_interview/BPs_07-19Heraeus.pdf>>.

Liang Zhenxian: "Integrated double sided cooling packaging of planar SiC power modules", 2015 IEEE Energy Conversion Congress and Exposition (ECCE), IEEE, Sep. 20, 2015 (Sep. 20, 2015), pp. 4907-4912, XP032801241.

Balogh, L., "Fundamentals of MOSFET and IGBT Gate Driver Circuits," Texas Instruments Application Report, SLUA618—Mar. 2017, Retrieved from internet URL: https://ghioni.faculty.polimi.it/pel/readmat/gate-drive.pdf, 65 pages.

Baranwal, S., "Common-mode transient immunity for isolated gate drivers," Analog Applications Journal, Texas Instruments (2015), Retrieved from internet URL: https://www.ti.com/lit/an/slyt648/slyt648.pdf?ts=1702052336068&ref_url=https%253A%252F%252Fwww.google.com%252F, 07 pages.

Boomer, K. and Ahmad H., "Performance Evaluation of an Automotive-Grade, High-Speed Gate Driver for SiC FETs, Type UCC27531, Over a Wide Temperature Range," NASA Electronic Parts and Packaging Program No. GRC-E-DAA-TN25898 (2015), Retrieved from Internet URL: https://ntrs.nasa.gov/api/citations/20150023034/downloads/20150023034.pdf, 08 pages.

Ke, X, et al., "A 3-to-40V 10-to-30MHz Automotive-Use GaN Driver with Active BST Balancing and VSW Dual-Edge Dead-Time Modulation Achieving 8.3% Efficiency Improvement and 3.4ns Constant Propagation Delay," 2016 IEEE International Solid-State Circuits Conference (ISSCC), IEEE, 2016, Retrieved from internet URL: https://picture.iczhiku.com/resource/ieee/WYkrsJrSQPoSjNXm.pdf, 03 pages.

Sridhar, N., "Impact of an Isolated Gate Driver," Texas Instruments: Dallas, Texas (2019), Retrieved from Internet URL: https://www.ti.com/lit/wp/slyy140a/slyy140a.pdf, 08 pages.

Sridhar, N., "Power Electronics in Motor Drives: Where is it?" Texas Instruments (2015), Retrieved from Internet URL: https://www.ti.com/lit/wp/slyy078a/slyy078a.pdf, 09 pages.

Sridhar, N., "Silicon Carbide Gate Drivers—a Disruptive Technology in Power Electronics," Texas Instruments, Dallas, Texas (2019), Retrieved from Internet URL: https://www.ti.com/lit/wp/slyy139/slyy139.pdf, 07 pages.

* cited by examiner

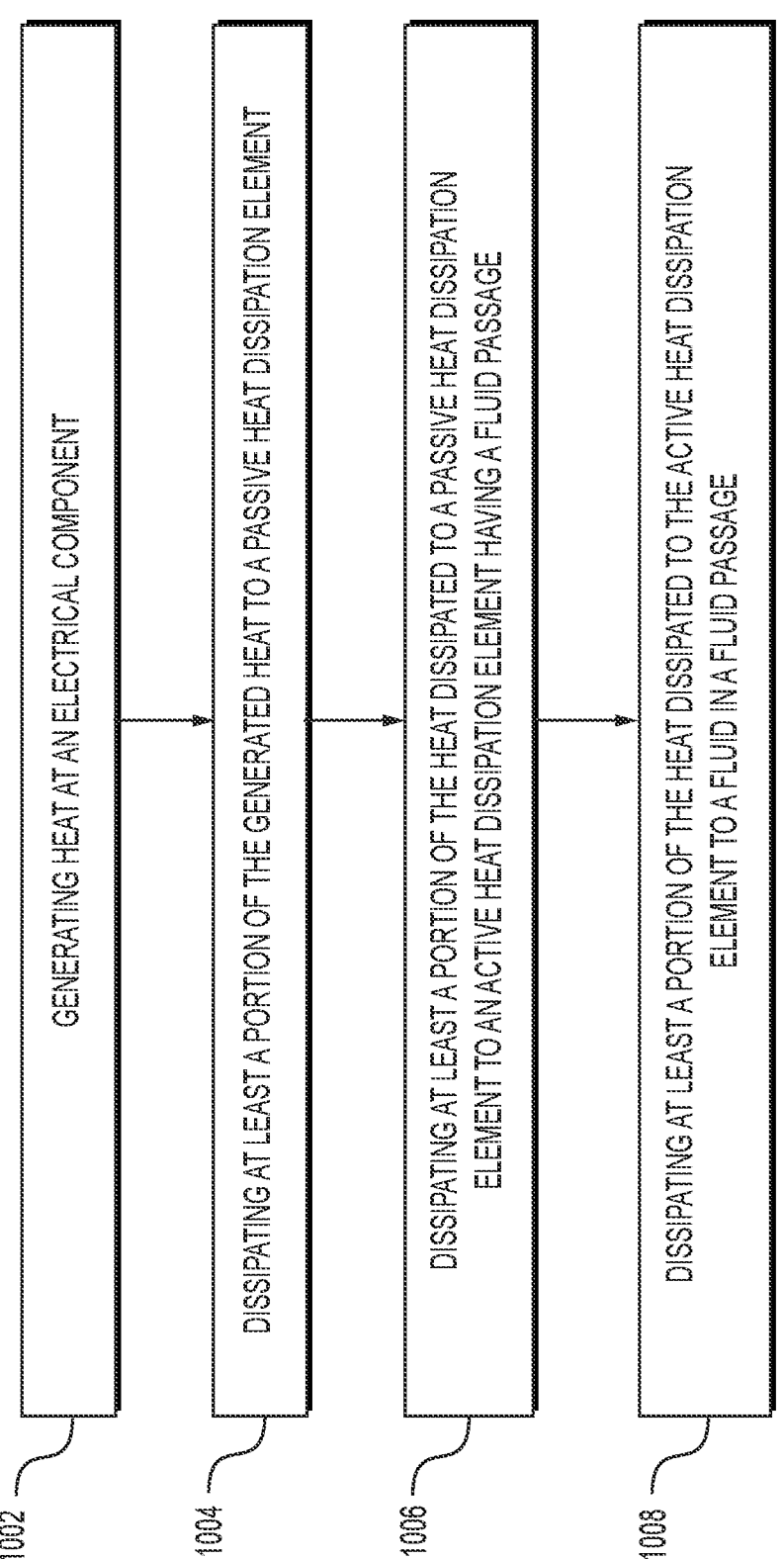

GENERATING HEAT AT AN ELECTRICAL COMPONENT

DISSIPATING AT LEAST A PORTION OF THE GENERATED HEAT TO A PASSIVE HEAT DISSIPATION ELEMENT

DISSIPATING AT LEAST A PORTION OF THE HEAT DISSIPATED TO A PASSIVE HEAT DISSIPATION ELEMENT TO AN ACTIVE HEAT DISSIPATION ELEMENT HAVING A FLUID PASSAGE

DISSIPATING AT LEAST A PORTION OF THE HEAT DISSIPATED TO THE ACTIVE HEAT DISSIPATION ELEMENT TO A FLUID IN A FLUID PASSAGE

1202 SINTERING A FIN SYSTEM TO A FIRST BASE SUBSTRATE

1204 SINTERING FIRST ELECTRICAL DEVICE COMPONENTS TO FIRST BASE SUBSTRATE

1206 SINTERING SECOND ELECTRICAL DEVICE COMPONENTS TO A SECOND BASE SUBSTRATE

1208 SOLDERING A HEAT DISSIPATION ELEMENT TO SECOND BASE SUBSTRATE

SYSTEMS AND METHODS FOR ACTIVE AND PASSIVE COOLING OF ELECTRICAL COMPONENTS

CROSS-REFERENCE TO RELATED APPLICATIONS

This application claims the benefit of priority to U.S. Provisional Patent Application No. 63/377,486, filed Sep. 28, 2022, U.S. Provisional Patent Application No. 63/377, 501, filed Sep. 28, 2022, U.S. Provisional Patent Application No. 63/377,512, filed Sep. 28, 2022, and U.S. Provisional Patent Application No. 63/378,601, filed Oct. 6, 2022, the entireties of which are incorporated by reference herein.

TECHNICAL FIELD

Various embodiments of the present disclosure relate generally to power switch cooling, and, more particularly, to combinations of passive and active cooling systems.

BACKGROUND

Automotive cooling systems often use one or more heat sinks to dissipate heat from power switches. Heat sinks provide effective means of dissipating heat by thermally conducting heat into a fluid medium, often via a Thermal Interface Material (TIM). Generally, a series of individual spring clamps provide the pressure required to compress the TIM over the product's lifetime.

The background description provided herein is for the purpose of generally presenting the context of the disclosure. Unless otherwise indicated herein, the materials described in this section are not prior art to the claims in this application and are not admitted to be prior art, or suggestions of the prior art, by inclusion in this section.

SUMMARY OF THE DISCLOSURE

In some aspects, the techniques described herein relate to a method for mounting a fin system in a power module, the method including: sintering a fin system to a first base substrate, the fin system including a plurality of fins attached to and extending away from a base plate; sintering a first power switch component to the first base substrate; sintering a second power switch component to a second base substrate; and soldering a heat dissipation element to the second base substrate.

In some aspects, the techniques described herein relate to a method, wherein at least one of the first base substrate or the second base substrate include a top substrate, a connection material, and a bottom substrate.

In some aspects, the techniques described herein relate to a method, wherein the fin system is sintered to the first base substrate via a first sintering layer, the first power switch component is sintered to the first base substrate via a second sintering layer, and the second power switch component is sintered to the second base substrate via a third sintering layer.

In some aspects, the techniques described herein relate to a method, wherein the heat dissipation element is one of an active heat dissipation element or a passive heat dissipation element.

In some aspects, the techniques described herein relate to a method, wherein each exterior surface of each of the plurality of fins includes a first exterior surface and a plurality of other exterior surfaces, the first exterior surface being attached to the base plate and the plurality of other exterior surfaces being floating surfaces.

In some aspects, the techniques described herein relate to a method, further including attaching the fin system sintered to the first base substrate, the first power switch component sintered to the first base substrate, the second power switch component sintered to the second base substrate, and the heat dissipation element soldered to the second base substrate to a fin housing including a casting and a fin housing base.

In some aspects, the techniques described herein relate to a method, wherein the attaching includes at least one of applying an adhesive, applying an epoxy attachment, applying an elastomeric sealing, or friction stir welding.

In some aspects, the techniques described herein relate to a method, further including: activating a power switch including the first power switch component and the second power switch component; and dissipating heat generated in response to activating the power switch to the fin system.

In some aspects, the techniques described herein relate to a method, further including: causing coolant to flow through a coolant passage including the plurality of fins; and dissipating a portion of the heat received at the fin system to the coolant.

In some aspects, the techniques described herein relate to a method, further including: activating a power switch including the first power switch component and the second power switch component; and dissipating heat generated in response to activating the power switch to the heat dissipation element.

In some aspects, the techniques described herein relate to a method, further including applying a fluid seal to sealingly isolate the plurality of fins from at least one of the first power switch component or the second power switch component.

In some aspects, the techniques described herein relate to a method, wherein at least one of the first power switch component or the second power switch component is at least one of a lead frame or a die.

In some aspects, the techniques described herein relate to a power module including: a fin system including a plurality of fins attached to and extending away from a base plate; a power switch including a first power switch component and a second power switch component; a first base substrate; a second base substrate; and a heat dissipation element, wherein the fin system is sintered to the first base substrate, the first power switch component is sintered to the first base substrate, the second power switch component is sintered to the second base substrate, and the heat dissipation element is soldered to the second base substrate.

In some aspects, the techniques described herein relate to a power module, wherein at least one of the first base substrate or the second base substrate include a top substrate, a connection material, and a bottom substrate.

In some aspects, the techniques described herein relate to a power module, wherein the fin system is sintered to the first base substrate via a first sintering layer, the first power switch component is sintered to the first base substrate via a second sintering layer, and the second power switch component is sintered to the second base substrate via a third sintering layer.

In some aspects, the techniques described herein relate to a power module, wherein the heat dissipation element is one of an active heat dissipation element or a passive heat dissipation element.

In some aspects, the techniques described herein relate to a power module, wherein the passive heat dissipation element includes a thermo-conductive cooling structure.

In some aspects, the techniques described herein relate to a power module, wherein each exterior surface of each of the plurality of fins includes a first exterior surface and a plurality of other exterior surfaces, the first exterior surface being attached to the base plate and the plurality of other exterior surfaces being floating surfaces.

In some aspects, the techniques described herein relate to a power module, wherein the plurality of fins are at least one of pin shaped, wave shaped, rectangular shaped, or oblong shaped.

In some aspects, the techniques described herein relate to a power module, further including a fin housing including a casting and a fin housing base.

Additional objects and advantages of the disclosed embodiments will be set forth in part in the description that follows, and in part will be apparent from the description, or may be learned by practice of the disclosed embodiments. The objects and advantages of the disclosed embodiments will be realized and attained by means of the elements and combinations particularly pointed out in the appended claims.

It is to be understood that both the foregoing general description and the following detailed description are exemplary and explanatory only and are not restrictive of the disclosed embodiments, as claimed.

BRIEF DESCRIPTION OF THE FIGURES

The accompanying drawings, which are incorporated in and constitute a part of this specification, illustrate various exemplary techniques and together with the description, serve to explain the principles of the disclosed techniques.

FIG. 10 depicts a flowchart for dissipating heat using a passive heat dissipation element and an active heat dissipation element, according to one or more embodiments.

DETAILED DESCRIPTION

Figure 1:
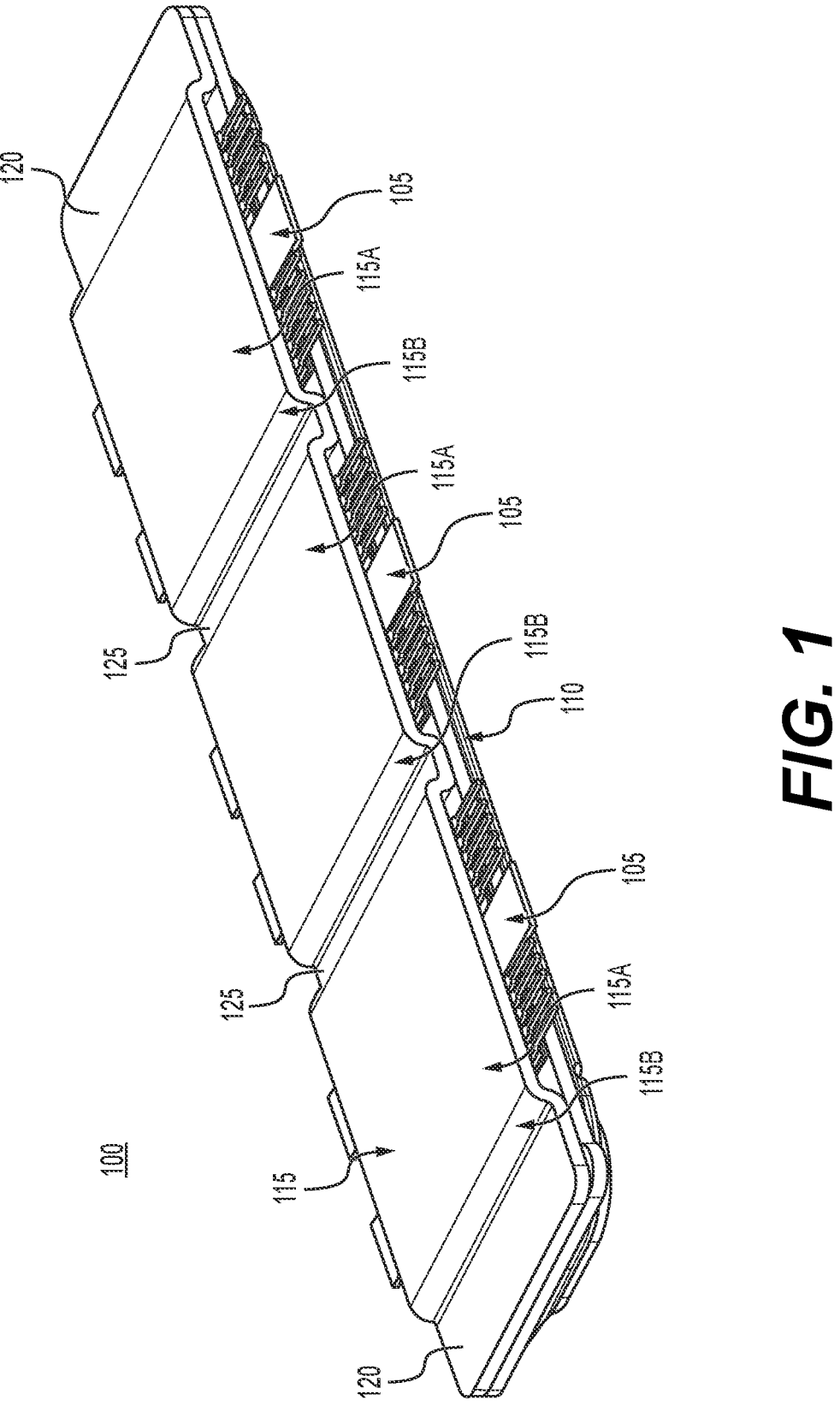
FIG. 1 depicts an exemplary plate combined cooling system, according to one or more embodiments.

The terminology used herein may be interpreted in its broadest reasonable manner, even though it is being used in conjunction with a detailed description of certain specific examples of the present disclosure. Indeed, certain terms may even be emphasized herein; however, any terminology intended to be interpreted in any restricted manner will be overtly and specifically defined as such in this Detailed Description section. Both the general description and the detailed description are exemplary and explanatory only and are not restrictive of the features, as claimed.

As used herein, the terms "comprises," "comprising," "having," including," or other variations thereof, are intended to cover a non-exclusive inclusion such that a process, method, article, or apparatus that comprises a list of elements does not include only those elements, but may include other elements not expressly listed or inherent to such a process, method, article, or apparatus. In this disclosure, relative terms, such as, for example, "about," "substantially," "generally," and "approximately" are used to indicate a possible variation of ±10% in a stated value. The term "exemplary" is used in the sense of "example" rather than "ideal." As used herein, the singular forms "a," "an," and "the" include plural reference unless the context dictates otherwise.

An electronic device cooling system may include two active heat sinks on either side (e.g., opposing top and bottom sides) of one or more electrical components, such as power switches. An active heat sink may be a heat sink having components (e.g., fins or compartments) through which a coolant material flows. For simplicity, this disclosure references electrical components as power switches, though it will be understood that the techniques disclosed herein may apply to any electrical component (e.g., power switches, chips, chip components, controllers, etc.) that may generate heat. Two active heat sinks may provide thermal dissipation by drawing heat away from the one or more power switches and towards a surface area of a power switch, and further towards an active heat sink that makes direct or indirect contact with a cooling medium, e.g., coolant or air, associated with the active heat sinks. As discussed herein, benefits of using a passive cooling structure include reducing the risk of a coolant leak (e.g., onto a power switch), reduced or controlled thermal resistance, reduced complexity, and the like. Accordingly, it may be desirable to improve cooling system function, e.g., by using combinations of active cooling (e.g., via an active heat sink) and passive cooling, alternative active cooling structures, or the like.

According to an example implementation, a cooling system may include a combination of active and passive cooling systems. For example, a cooling system may include an active cooling system, e.g., an active heat sink, and a passive cooling system, e.g., a passive heat sink having a thermo-conductive cooling structure. The thermo-conductive cooling structure may include a plate of thermally conductive materials, as described in more detail below. The passive heat sink (e.g., thermo-conductive cooling structure) may contact both the active heat sink and a power switch. The passive heat sink (e.g., thermo-conductive cooling structure) may be configured to dissipate heat away from the power switch and toward the active heat sink.

According to another example implementation, the cooling system may include a fin structure. The fin structure may include fins sintered to one side of each individual power switch, and may be sealed against a power switch housing. This fin structure may be an active cooling system and may be combined with another active cooling system, e.g., an active heat sink, or a passive heat sink, e.g., a thermo-conductive cooling structure. In some implementations, the fin structure may be in direct physical and/or thermal contact with a cooling structure, e.g., an active heat sink or a thermo-conductive cooling structure, and to each power switch substrate of a power module.

FIG. 1 depicts an exemplary combined cooling system 100, according to one or more embodiments. The combined cooling system 100 may include one or more power switches 105 (generally referred to as power switch 105), an active heat sink 110, which may be a single active heat sink or a combination of adjacent and/or attached heat sinks, and a passive heat sink 115, which may be a single component or a combination of adjacent and/or attached components. Active heat sink 110 may be an active cooling solution and passive heat sink 115 may be a passive cooling solution. For example, active heat sink 110 may actively dissipate heat to a coolant medium whereas passive heat sink 115 may dissipate some or all heat to active heat sink 110 or another heat dissipation component. As further discussed herein, heat dissipated from power switch 105 may be dissipated via both active heat sink 110 and passive heat sink 115. Passive heat sink 115 may passively transfer heat to active heat sink 110 via one or more contacts with active heat sink 110, as further discussed below. According to embodiments of the disclosed subject matter, both active and passive cooling may be implemented by using the passive heat sink 115 and active heat sink 110 disclosed herein.

Power switch 105 may include, e.g., approximately a 400-Volt or 800-Volt Silicon Carbide Inverter for electrified vehicles, although other suitable structures and components are also contemplated. Power switch 105 may include one or more silicon carbide (SiC)-based power switches that deliver relatively high power densities and efficiencies needed to, for example, extend battery range and performance. Power switch 105 may include circuitry and components that are configured to convert direct current (DC) from the electric vehicle battery to alternating current (AC) current, which can be utilized, for example, within an electric motor that drives a propulsion system. Power switch 105 may be installed on one or more power board assemblies. A power board assembly may include one or more power switches 105 (e.g., six power switches 105), one or more active heat sinks 110, one or more passive cooling structures or cooling jackets, and/or mechanical components to ensure the mechanical integrity of the power module assembly. A power board assembly may include an array of electronic packages and input/output (I/O) devices disposed on a circuit board. The one or more power switches 105 may be of any suitable form, e.g., an electronic power switch, with any suitable configuration, e.g., single pole single throw.

Power switch 105 may be disposed in or between one or more surfaces that may form a power switch housing. For example, the one or more power switches 105 may be disposed within a housing having a first surface including or facing active heat sink 110 and a second surface including or facing passive heat sink 115. Power switch 105 may thermally and/or mechanically contact a surface of active heat sink 110 and/or a surface of passive heat sink 115 via any suitable means. These connections may allow for various assembly conditions. For example, power switch 105 may be adhered to the one or more surfaces using soldering or sintering, or may be attached using any mechanical or adhesive component such as a clamp, a spring pressure component, or the like. Power switch 105 may mechanically contact active heat sink 110, passive heat sink 115, or both active heat sink 110 and passive heat sink 115. This contact may enable heat generated from the operation of power switch 105 to dissipate across active heat sink 110 and/or passive heat sink 115, as described in more detail below.

A passive cooling system (e.g., passive heat sink 115) may be different than an active cooling system (e.g., active heat sink 110) such that the passive cooling system does not directly dissipate heat via a coolant (e.g., a fluid or air). Accordingly, no portion of a passive cooling structure is in direct contact with a coolant in some embodiments. Rather, a passive cooling system may include, for example, a uniform conductive surface that covers (e.g., partially or fully covers) or faces at least one surface of power switch 105. The uniform conductive surface may be substantially parallel to the at least one surface of power switch 105. Each power switch 105 may be associated with a corresponding uniform conductive surface of a passive cooling component, as shown in FIG. 1. The surface of power switch 105 may be in contact with the uniform conductive surface of the passive cooling system. Further, given that a passive cooling system (e.g., a passive heat sink) may not directly contact a coolant, the shape of a cooling system including one or more thermo-conductive cooling systems may be customizable. For example, an active cooling system may be designed to have a coolant medium through portions of the active cooling structure. A passive cooling structure may allow design flexibility as its design may not be limited by coolant flow considerations. Accordingly, a passive cooling system may provide greater flexibility of components, dimensions, and/or locations in comparison to active cooling systems.

Figure 2:
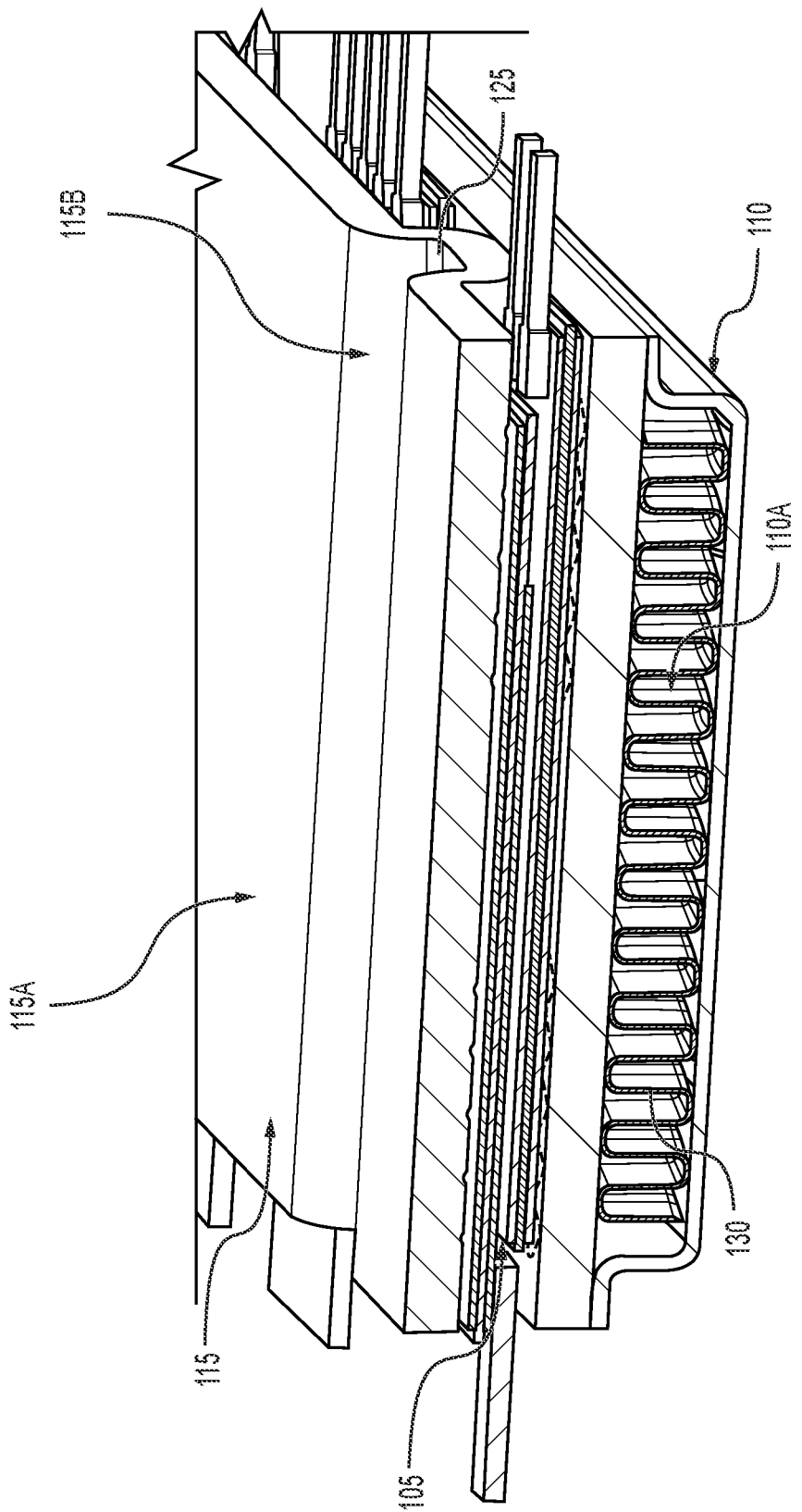
FIG. 2 depicts a cross-sectional view of the exemplary plate combined cooling system of FIG. 1, according to one or more embodiments.

FIG. 2 depicts a cross-sectional view of an exemplary combined active and passive cooling system 100. As shown in greater detail in FIG. 2, active heat sink 110 may provide a thermal interface for power switch 105 such that heat radiated from power switch 105 is dissipated via active heat sink 110 (e.g., directly or via passive heat sink 115, as further discussed herein). Active heat sink 110 may include multiple components. The material of active heat sink 110 may be selected based on an applicable thermal performance to cool the power switches 105. For example, active heat sink 110 may include copper, aluminum alloys, other conductive materials, etc. or combinations thereof. In some embodiments, active heat sink 110 may be similar in operation to a radiator used in an internal combustion engine. Active heat sink 110 may be configured to have one or more coolant channels 110A. The one or more coolant channels 110A may be used to disperse coolant (e.g., fluid or air) to active heat sink 110. Further, a power module seal may be provided between the one or more coolant channels 110A and power switch 105 to prevent leakage. Active heat sink 110 may include an inlet (not shown in FIG. 2) and outlet (not shown in FIG. 2) on opposing sides of the active heat sink 110. The inlet and outlet each may extend through a base plate. The inlet and outlet may be configured to facilitate circulation of coolant via of the one or more coolant channels 110A. As shown in FIG. 2, active heat sink 110 may be mounted on an opposite side of power switch 105, relative to passive heat sink 115 (e.g., a top or bottom side).

Accordingly, active heat sink 110 may dissipate heat generated at power switch 105 (e.g., via coolant channel 110A). Passive heat sink 115 may be mounted on the opposite side of power switch 105 as active heat sink 110 and may be in direct physical and thermal contact with active heat sink 110. Passive heat sink 115 may include any material suitable for conducting and/or dissipating heat, including, but not limited to, copper, aluminum, etc., or a combination thereof. At least a portion of passive heat sink 115 may be in direct contact with active heat sink 110 such that there is no intervening structure between passive heat sink 115 and active heat sink 110. Accordingly, heat from power switch 105 may be dissipated via passive heat sink 115 and may further be transferred to active heat sink 110 for further dissipation. Including only one active heat sink facing one surface of power switch 105 (e.g., such that an opposite surface of power switch 105 faces a passive cooling system) may reduce the risk of leaks, e.g., coolant leaks, and may decrease the cost associated with production and/or maintenance of a device, when compared to having two active heat sinks on opposite sides of power switch 105.

Active heat sink 110 may include one or more fins 130 that extend into a coolant medium, e.g., air, a refrigerant, water, oil, etc. The coolant channel 110A may be formed using the one or more fins 130. The one or more fins 130 may be configured to have a high surface area to maximize heat dissipation into the coolant medium. The one or more fins 130 may have any suitable configuration, including, but not limited to, fins (e.g., cylindrical), straight fins, flared fins, etc. The one or more fins 130 may be composed of any suitable materials or combination of materials, such as copper, aluminum alloys, or a combination thereof. The coolant medium may flow through active heat sink 110 and around the one or more fins 130. According to an embodiment, the one or more fins may extend perpendicularly away from a surface of power switch 105 that faces active heat sink 110.

As shown in FIG. 2, the one or more fins 130 may extend outwardly from power switch 105, terminating or positioned within a heat sink fin compartment. In one embodiment, power switch 105 may be located on or adjacent to a surface of heat sink fin compartment. The weight of power switch 105 may be structurally supported, at least in part, by the heat fin sink compartment or the active heat sink 110. A modular approach may be taken by forming a heat sink fin compartment, which may be sealed or welded to a main heat sink compartment.

The heat sink fin compartment may include or be connected to seals at points where the heat sink fin compartment connects to a housing or other component of active heat sink 110. The seals may include any suitable material (e.g., high-polymer vinyl methyl polysiloxanes (silicone), rubber, neoprene, nitrile, ethylene-propylene diene monomer (EPDM), fluorocarbons, etc.) or configuration (e.g., O-ring gasket, manifold seal, labyrinth seal, a plate or sheet, an elastomeric seal, etc.). In some embodiments, the one or more fins 130 may extend away from power switch 105, or the like. Such configurations may create a seal around the fins 130 to prevent the coolant medium of heat sink fin compartment from leaking or escaping.

Figure 3:
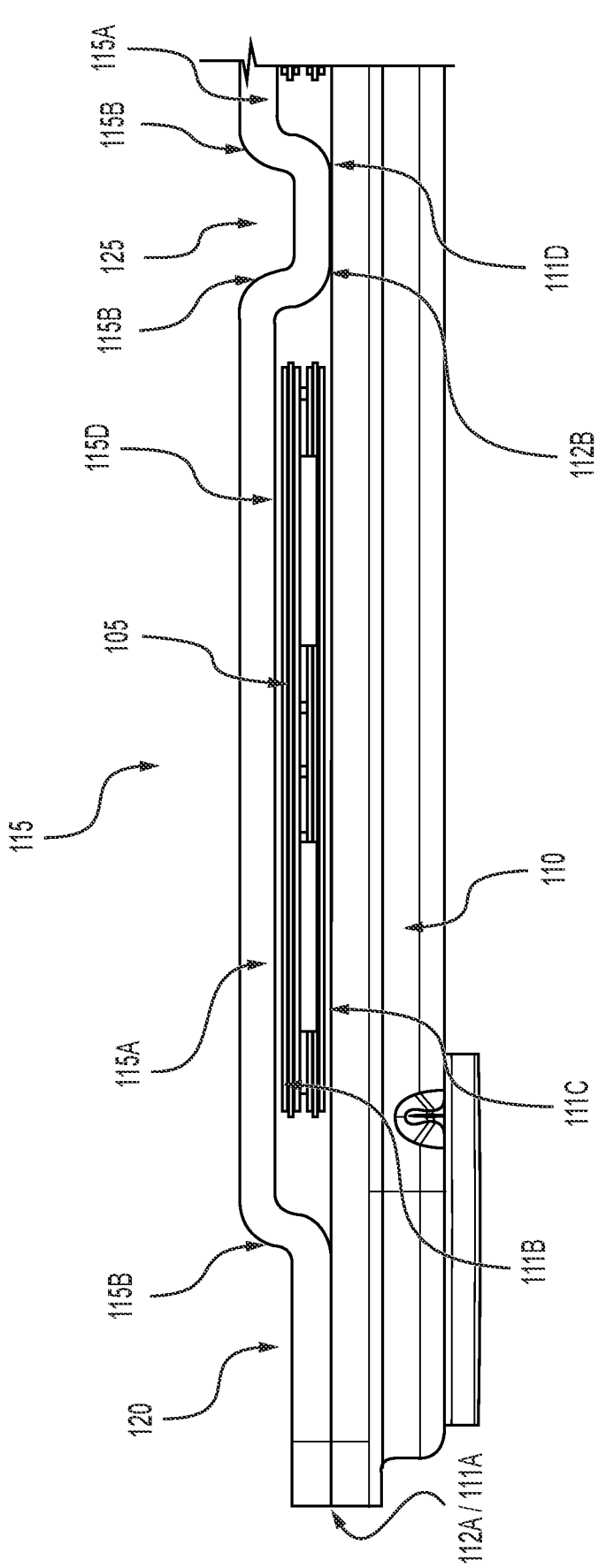
FIG. 3 depicts a side view of the exemplary plate combined cooling system of FIG. 1, according to one or more embodiments.
Figure 4:
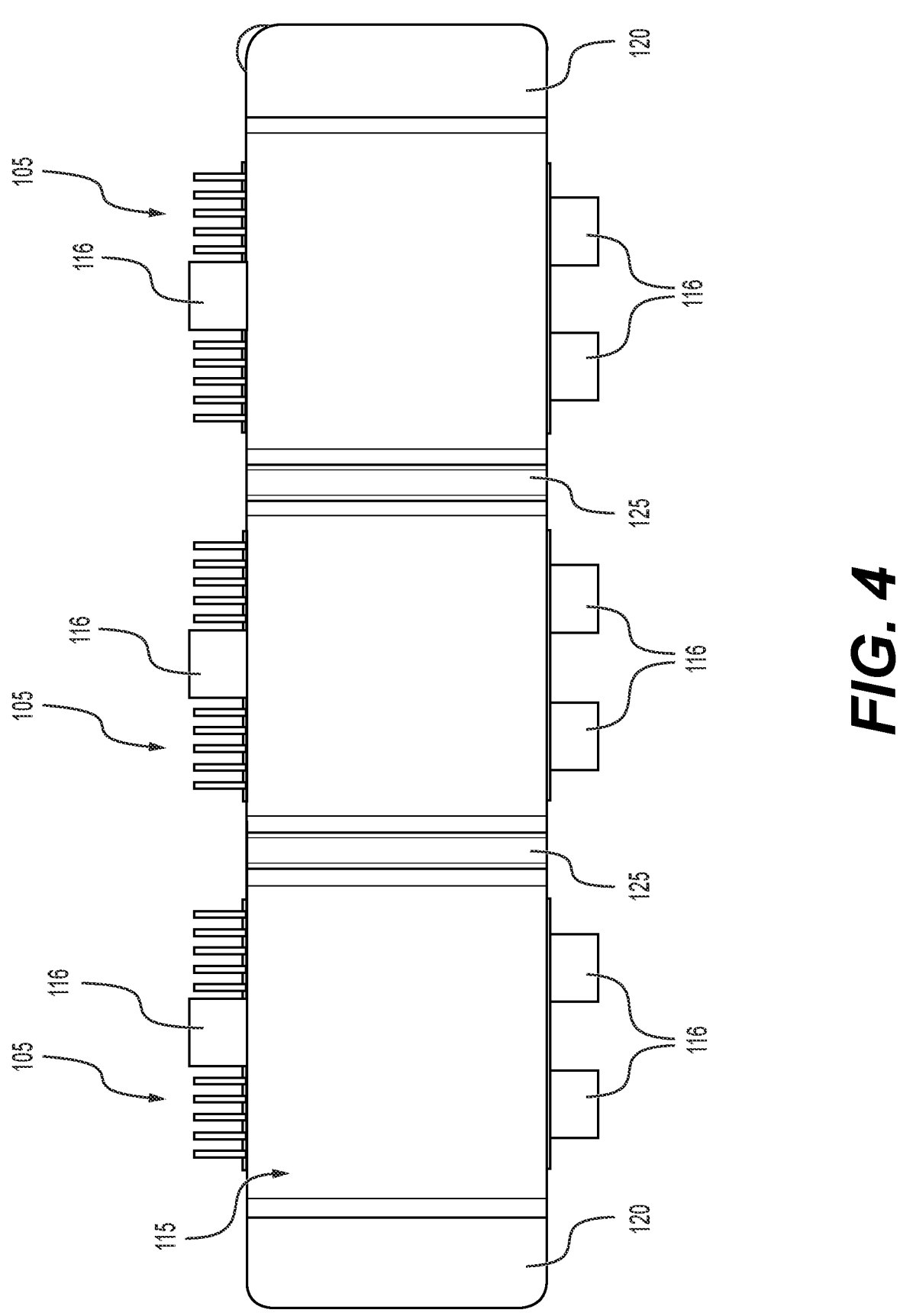
FIG. 4 depicts a top view of the exemplary plate combined cooling system of FIG. 1, according to one or more embodiments

FIG. 3 depicts a side view of the exemplary combined cooling system 100 of FIG. 1, and FIG. 4 depicts a top view of the exemplary combined cooling system 100 of FIG. 1. As depicted in FIG. 3 and FIG. 4, passive heat sink 115 may be configured to mechanically contact the one or more power switches 105 and active heat sink 110. For example, as shown in FIG. 3, a surface 115D may contact power switches 105, and one or more contact surfaces such as clamp structure 120 and/or contact interfaces 125 may contact active heat sink 110 and/or a conductive component in direct contact with active heat sink 110. According to an embodiment Thermal Interface Material (TIM) may be positioned between one or more contact surfaces such as clamp structure 120 and/or contact interfaces 125 may active heat sink 110 and/or a conductive component in direct contact with active heat sink 110. Heat may dissipate from a surface of power switch 105 facing the surface 115D to the passive heat sink 115. The heat from passive heat sink 115 may dissipate from passive heat sink 115 to active heat sink 110 via clamp structure 120 and/or contact interfaces 125. Passive heat sink 115 may include one or more components, e.g., a single or multiple pieces of copper or other conductive material that, when joined or connected together, form a contiguous or continuous passive heat sink 115. For example, a single component passive heat sink 115 may extend across multiple power switches 105. Alternatively, for example, multiple segments of passive heat sink 115 may extend across respective power switches 105 and may be joined or connected to each other segment.

FIG. 3 shows at least one cross-section of power switch 105 surrounded by passive heat sink 115 and active heat sink 110. Accordingly, heat dissipated by power switch 105 may be dissipated by passive heat sink 115 and/or active heat sink 110.

As shown in FIG. 1, FIG. 2, and FIG. 3, passive heat sink 115 may include planar portions 115A on a first plane that may be connected to respective clamp structures 120 and/or contact interfaces 125 via curved portions 115B. Different planar portions 115A may be on a same plane. Planar portions 115A may on a first plane and clamp structures 120 and/or contact interfaces 125 may be on a second plane. The first plane may be substantially over or above the plane of a surface of power switch 105 that faces passive heat sink 115. The second plane may be substantially below or parallel to the plane of a surface of power switch 105 that faces away from passive heat sink 115.

As shown in FIG. 3, active heat sink 110 may cover one surface of power switch 105. Passive heat sink 115 may cover other surfaces of power switch 105. As shown, surface 115D of planar portion 115A of passive heat sink 115 may cover at least a portion of the surface of power switch 105 facing passive heat sink 115. Curved portions 1156 joining planar portions 115A to and/or including clamp structure 120 and/or contact interfaces 125 may cover one or more surfaces of power switch 105.

TIM may be provided at points where heat is thermally dissipated between one or more component of a power module. For example, as shown in FIG. 3, TIM 111A may be provided between clamping structures 120 and active heat sink 110, TIM 111B may be provided between passive heat sink 115 and power switch 105, TIM 111C may be provided between power switch 105 and active heat sink 110, and TIM 111D may be provided between contact interfaces 125 and active heat sink 110. As also shown in FIG. 3, passive heat sink 115 may be connected to active heat sink 110 at sinter/solder point 112A (e.g., to connect clamp structure 120 to active heat sink 110) and/or sinter/solder point 112B (e.g., to connect contact interfaces 125 to active heat sink 110).

FIG. 4 shows a top view of passive heat sink 115 with at least a portion of the one or more power switches 105 extending outward past passive heat sink 115. For example, one or more connective features 116 of the one or more power switches may extend outward and do not directly contact passive heat sink 115 and/or active heat sink 110. The exterior of passive heat sink 115, as depicted in FIG. 4, may terminate at either end of the cooling system and connect to active heat sink 110 via one or more clamping structures 120. Passive heat sink 115 may curve or bend to surround power switch 105 (e.g., on three sides) and to connect passive heat sink 115 to active heat sink 110 via one or more contact interfaces 125. The curves or bends in passive heat sink 115 may increase the amount of surface area in contact between passive heat sink 115 and active heat sink 110, e.g., via the one or more contact interfaces 125, and/or between passive heat sink 115 and power switch 105. The one or more contact interfaces 125 may form a planar surface along the active heat sink 110. According to an embodiment, passive heat sink 115 may include an amount of contact interfaces 125 proportionate to the overall size of cooling system 100, the heat exuded by power switch 105, etc. For example, a surface area of the one or more contact interfaces may be proportional to the average heat dissipated by the power switch.

Passive heat sink 115 may be in a bent or curved configuration such that portions of passive heat sink 115 contact active heat sink 110 at either/both ends of a power switch 105, e.g., via clamp structures 120 and/or contact interfaces 125. Portions of passive heat sink 115 may mechanically and/or thermally contact power switch 105. Portions of passive heat sink 115 may mechanically and/or thermally contact active heat sink 110. The use of clamp structures 120 and/or contact interfaces 125 may provide multiple thermal paths to an active cooling system (e.g., via active heat sink 110) and/or coolant. In some embodiments, passive heat sink 115 may be mechanically directly connected to active heat sink 110 using clamp structures 120, e.g., via spring clamps, sintering, soldering, or other connection mechanisms. According to an embodiment, connecting active heat sink 110 and passive heat sink 115 via a spring loading system may distribute the force across passive heat sink 115, better enforcing the connection between the structures and applying a clamp force to power switch 105. Passive heat sink 115 may mechanically and/or thermally contact power switch 105 via a planar surface of power switch 105 (e.g., via TIM) and may mechanically and/or thermally contact active heat sink 110 via one or more clamp structures 120 and/or contact interfaces 125. The one or more clamp structures 120 and/or contact interfaces 125 may be configured as a planar surface that may extend along a planar surface of active heat sink 110. The one or more contact interfaces 125 may attach or connect to active heat sink 110 via any suitable method, e.g., laser welding, clamp force, spring loading, etc. The strength of the attachment or connection between the one or more interfaces 125 and active heat sink 110 and/or between the passive heat sink 115 and the one or more power switches 105 may exceed the strength or connection of a brazed copper fluid carrying structure. Accordingly, the passive heat sink 115 may result in a rigid structure to facilitate clamping and distribution of force across multiple power switches 105.

A passive cooling structure, such as passive heat sink 115 may be shaped to be enclosure-free. As discussed herein, enclosure-free may refer to a structure that does not include a chamber or a fluid passage. For example, active heat sink 110, as disclosed herein, include a fluid passage chamber for fluid flow. A passive cooling structure may not include a chamber or other enclosure such that fluid cannot flow through the passive cooling structure. A passive cooling structure may be shaped such each surface of the passive heat dissipation element terminates in free space. For example, as shown in FIGS. 1-4, each surface of as passive heat sink 115 may be non-overlapping such that no chamber or passage is formed by connecting a portion of as passive heat sink 115 to another portion of as passive heat sink 115. It will be understood that although each surface of the passive heat dissipation element terminates in free space, one or more portions of passive heat sink 115 may be in contact with or may otherwise connect to other components (e.g., active heat sink 110). For example, as shown in FIG. 3, passive heat sink 115 may be in contact with active heat sink 110 at clamp structure 120 and/or contact interfaces

125. Accordingly, each surface of the passive heat dissipation element may terminate in free space, and one or more portions of the passive heat dissipation element terminating in free space may be in direct and/or thermal contact with one or more other components (e.g., active heat sink 110).

There may exist a relationship (e.g., described by Fournier's law or any other applicable transform, algorithm, etc.) between the heat transferred from the power switch 105 to the passive heat sink 115. In other words, passive heat sink 115 may be configured to dissipate heat from power switch 105 in a linear or non-linear manner. According to an implementation, the configuration of active heat sink 110 and passive heat sink 115 may be sufficient to meet heat dissipation requirements for power switch 105 operating below a threshold current. For example, the threshold current may be approximately 500 amps or lower, approximately 450 amps, approximately 400 amps, or the like.

While passive heat sink 115 is shown with active heat sink 110 underneath power switch 105 and passive heat sink 115, it will be understood that the components may be in any suitable configuration. For example, in some embodiments, active heat sink 110 may be configured to sit on the opposite side of power switch 105 than the configuration shown in FIG. 2 (e.g., such that the active heat sink 110 and passive heat sink 115 are swapped). In another example, the components may be configured to mount (e.g., to an engine or vehicle component) in a vertical or angled orientation.

By adding a passive heat sink (e.g., a thermally-conductive structure) in place of an active second heat sink through which a coolant is actively flowed, production and/or maintenance costs may be significantly reduced. Further, since coolant passes through a single heat sink, the risk of coolant leaks may be mitigated in comparison to coolant passing through multiple heat sinks. Passive heat sink 115 may further provide structural support to a device based on its rigid form and may be configured to distribute pressure more evenly than active heat sink 110. For example, passive heat sinks may be more rigid in comparison to active heat sinks (e.g., based on material properties, configuration, and/or one or more contiguous portions). Passive heat sinks may experience reduced deformation in comparison to heat sinks composed of soft annealed copper.

In some embodiments, in lieu of one or more active heat sinks 110, the one or more fins may be adhered, e.g., sintered, to a base plate such as a direct bond copper structure, the direct bond copper structure disposed between the fins and power switch 105. In this way, power switch 105 may be in the direct thermal path of the coolant flow to minimize the thermal resistance of the system. Any suitable number of fins may be adhered to the base plate, e.g., approximately 200 fins per power switch 105. The number and placement of fins 130 may be optimized to ensure proper flow characteristics and sintering capability.

Figure 5:
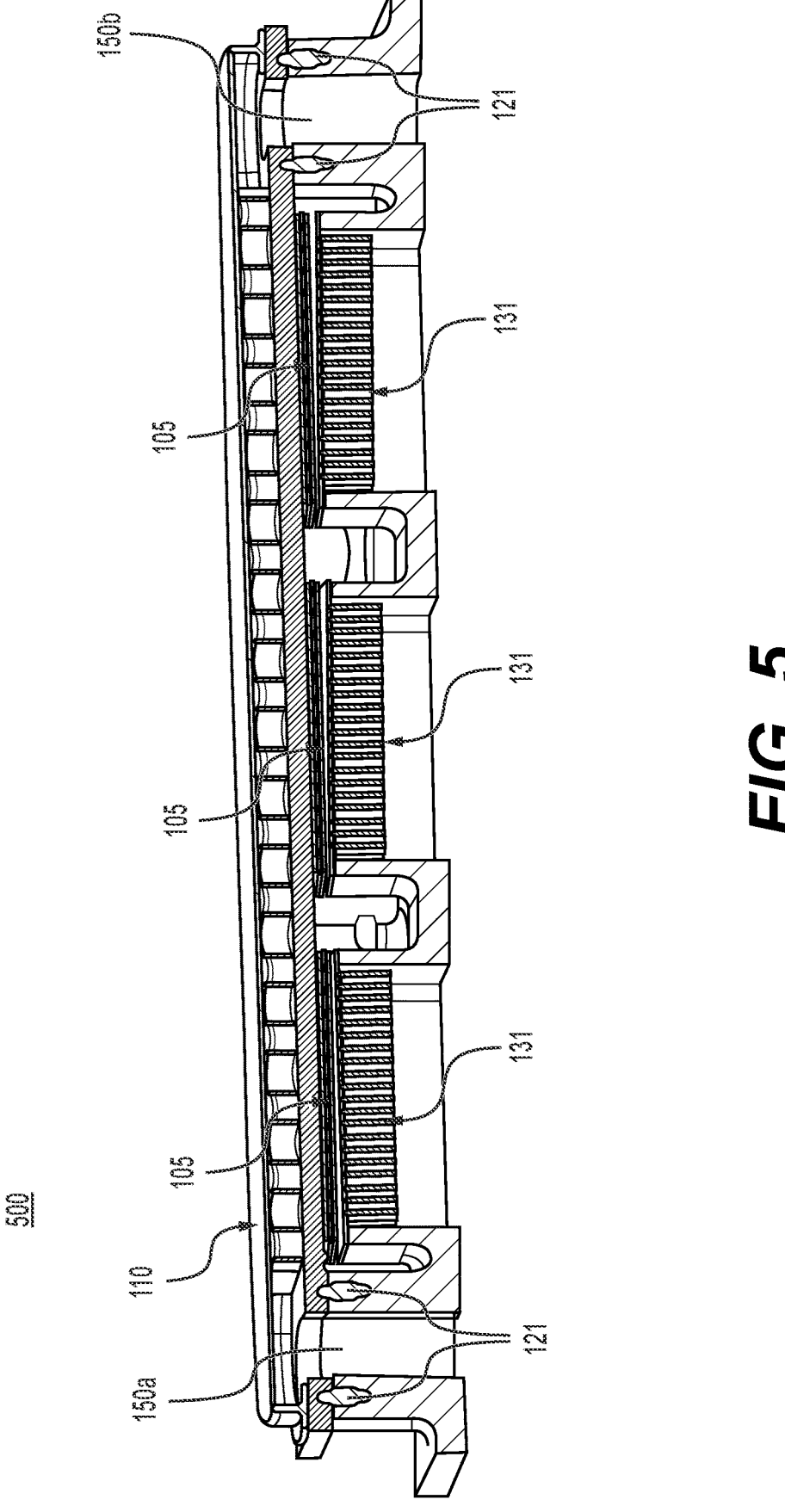
FIG. 5 depicts a cross-sectional view of an exemplary fin combined cooling system, according to one or more embodiments.

According to embodiments of the disclosed subject matter, a fin system may be used for active cooling of electronic components such as power switch 105. FIG. 5 depicts a cross-sectional view of an exemplary cooling system 500, which may include one or more power switches 105 (generally referred to as power switch 105 herein), an active heat sink 110, and a fin system 131. As shown, one or more power switches 105 may be disposed between one or more surfaces. For example, the one or more power switch 105 may be disposed within a housing. A first surface of power switch 105 may face and/or be attached to active heat sink 110 or a passive cooling structure (not shown in FIG. 5) and a second surface (e.g., an opposite surface) of power switch 105 may face and/or be attached to fin system 131. The power switch 105 may thermally and/or mechanically contact, e.g., be adhered to, attached to, connected to, etc., a surface of active heat sink 110, a passive cooling structure (e.g., passive heat sink 115), and/or to a surface of fin system 131 via any suitable means. For example, the one or more power switches 105 may be adhered to the one or more surfaces using soldering or sintering, as described in more detail below. This contact may allow heat generated from the operation of the one or more power switches 105 to dissipate across active heat sink 110, the passive cooling structure, and/or fin system 131, as described in more detail below.

Unlike the continuous fins of some active heat sinks, the fins of fin system 131 may be discrete such that each fin of fin system 131 may be detached from each other fin of fin system 131. Accordingly, the fins of fin system 131 may be connected by a base plate such that all surfaces of the fins are exposed except for a single surface of each fin, at the base plate. Additionally, the fins of an active heat sink may substantially extend the length of one surface of the active heat sink. The discrete fins of fin system 131 may not extend the length of a surface of a heat sink but, rather, may extend approximately less than 20%, less than 15%, less than 10%, less than 5%, less than 3% or the like of the length of a surface of the heat sink. Additionally, as discussed herein, the discrete fins of fin system 131 may be directly connected to a base plate attached to a power switch 105, such as via sintering or soldering.

Figures 8A, 8B:
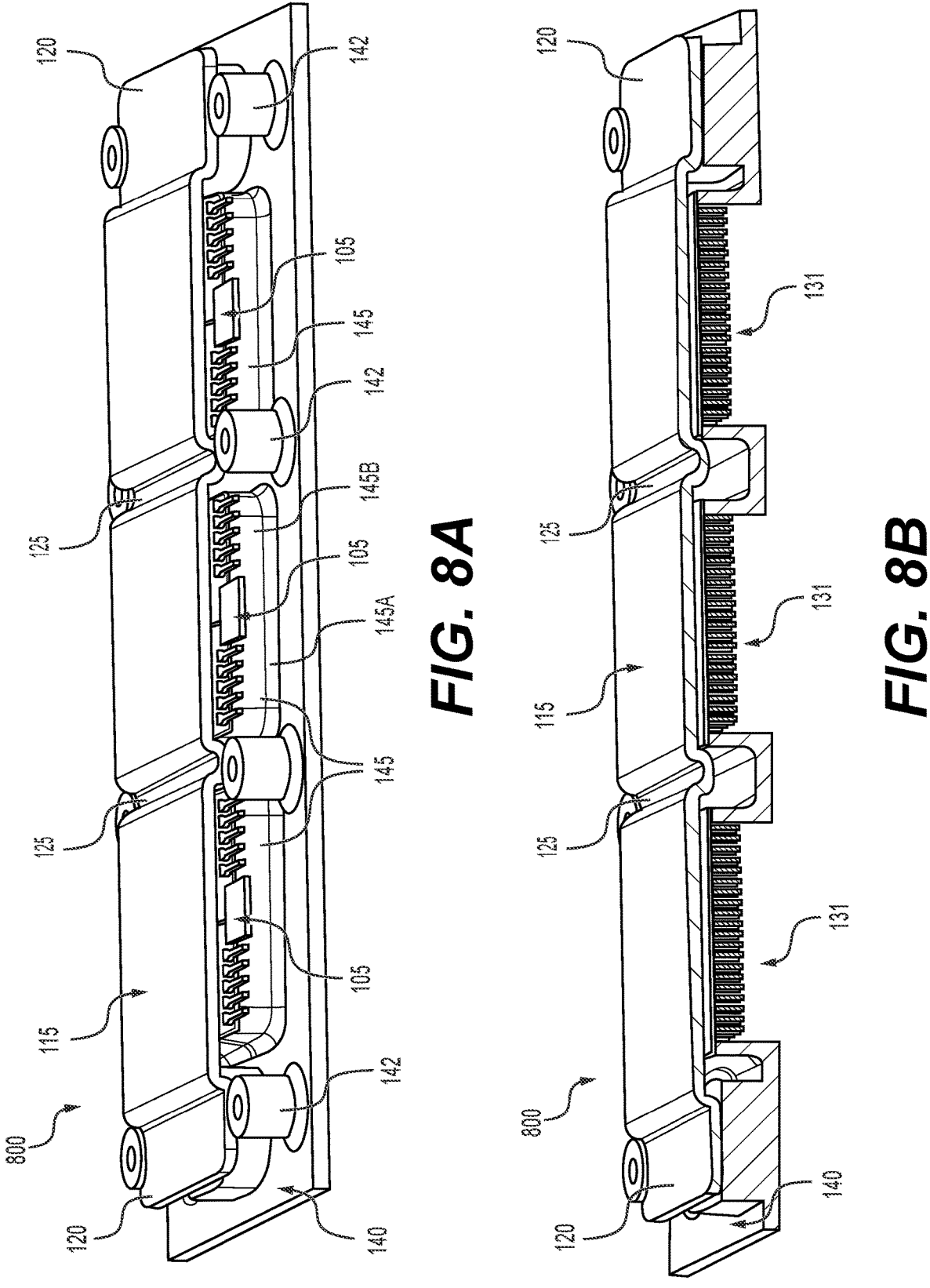
FIGS. 8A and 8B depict exemplary plate-fin combined cooling systems, according to one or more embodiments.

Fin system 131 (e.g., as shown in FIG. 5 and FIG. 8B) may be positioned in fin housing 145 which includes a fin housing base 145A and a casting 145B shown in FIG. 8A. Fin system 131 may include a plurality of fins (e.g., rods) extending away from power switch 105 towards fin housing base 145A. Power switch 105 may be sealingly isolated from fin system 131 such that coolant (e.g., fluid passed through a fluid passage created between fin system 131 and fin housing 145) does not leak to power switch 105. For example, power switch 105 may be sealingly isolated from fin system 131 via an elastomeric seal (e.g., where the elastomeric seal connects casting 145B to fin housing base 145A). Fin housing base 145A may include a surface that faces the fin system 131. Fin housing base 145A and casting 145B may form a chamber through which a coolant may flow. The casting may connect or be in contact with an exterior surface of power switch 105 (e.g., via base plate 119 or other component). Fin housing 145 may include one or more protrusions, as further discussed in reference to FIG. 8A and FIG. 8B, that friction stir weld the exterior surface of the power switch 105 to the casting. The friction stir weld may generate sufficient friction to sealingly connect power switch 105 to fin housing 145, to prevent coolant leakage. Fin housing 145 may include one or more protrusions that epoxy attach the exterior surface of the power switch 105 to the casting. The epoxy attachment may provide sufficient sealing to connect power switch 105 to fin housing 145, to prevent coolant leakage. Fin housing 145 (e.g., via the casting 145B) may be sealingly attached to the power switch via friction stir welding the fin housing 145 to an exterior surface of power switch 105 (e.g., with or without protrusions). Fin housing 145 (e.g., via the casting 145B) may be sealing attached to the power switch via epoxy attaching the fin housing 145 to an exterior surface of power switch 105 (e.g., with or without protrusions). Accordingly, an exterior surface of power switch 105, casting 145B, and fin housing base 145A may form a chamber for a coolant medium to flow through to dissipate heat away from fin system 131.

Figure 6:
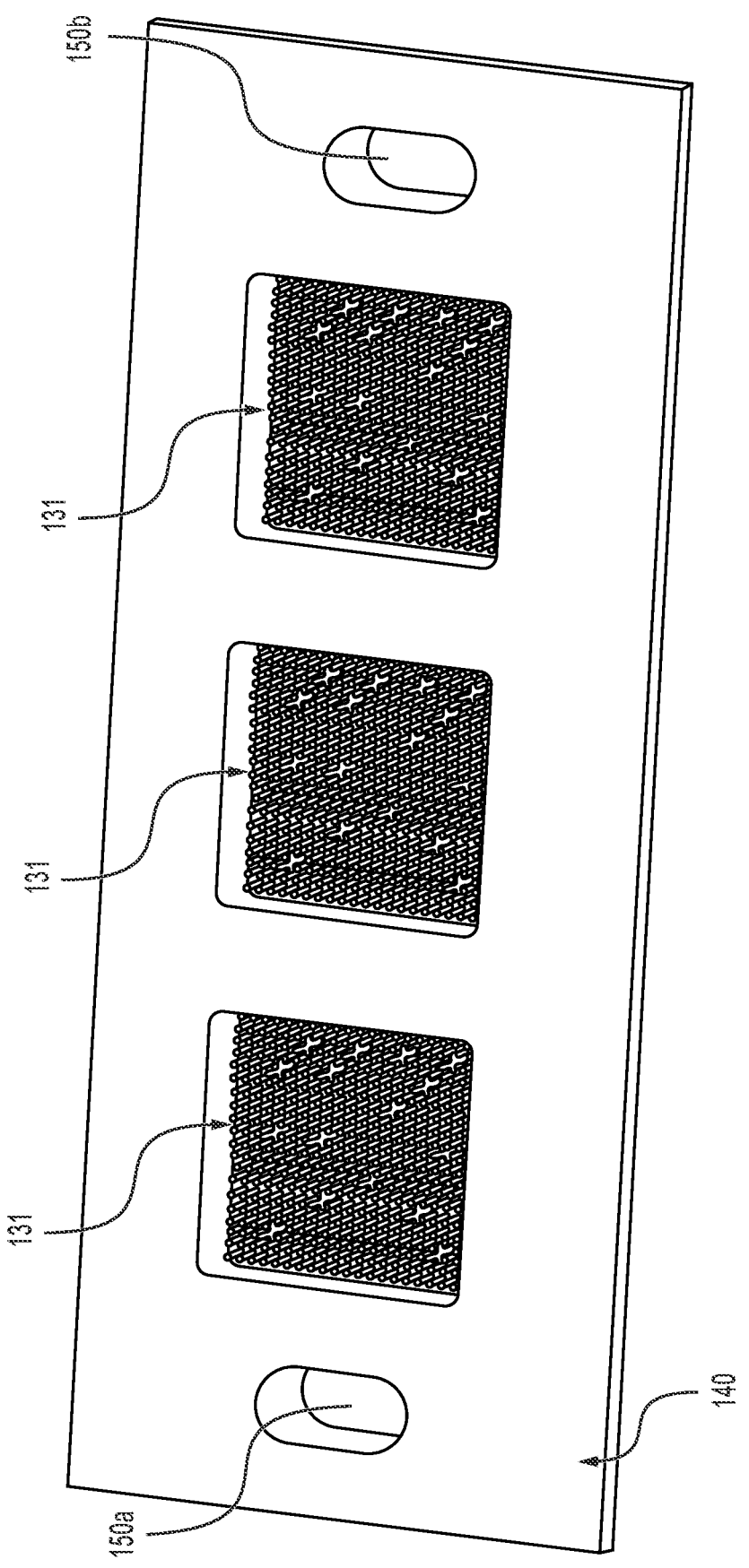
FIG. 6 depicts a base view of an exemplary fin combined cooling system, according to one or more embodiments.

FIG. 6 depicts a base view of an exemplary fin combined cooling system. As depicted in FIG. 6, active heat sink 110 may include an inlet 150a and outlet 150b. Inlet 150a and outlet 150b may be on opposing sides of active heat sink 110. Inlet 150a and outlet 150b may extend through a base plate 140 such that fluid is received via inlet 150a and expelled through outlet 150b for fluid flow via active heat sink 110. The one or more fin system 131 may be configured to have one or more coolant channels through the fin system 131. This embodiment may include a single active heat sink 110, mounted on the opposite side of power switch 105 relative to fin system 131. Accordingly, heat may be actively dissipated via both an active heat sink 110 and fin system 131. Including only one active heat sink may reduce the risk of leaks, e.g., coolant leaks, and may decrease the cost associated with production and/or maintenance.

Alternatively, a passive cooling component (e.g., passive heat sink 115) may be positioned facing a surface of power switch 105, as further discussed in reference to FIG. 8A and FIG. 8B below. A passive cooling structure may passively dissipate heat (e.g., without a coolant medium) and/or may transfer heat to fin system 131 via one or more contacts the fin system, as further discussed herein. Accordingly, a passive cooling system (e.g., passive heat sink 115) may be in contact with fin system 131 via a direct or indirect connection. Heat may be dissipated from the passive cooling system to fin system 131 in a manner similar to that discussed above in reference to dissipating heat from a passive cooling system to active heat sink 110.

Figure 7:
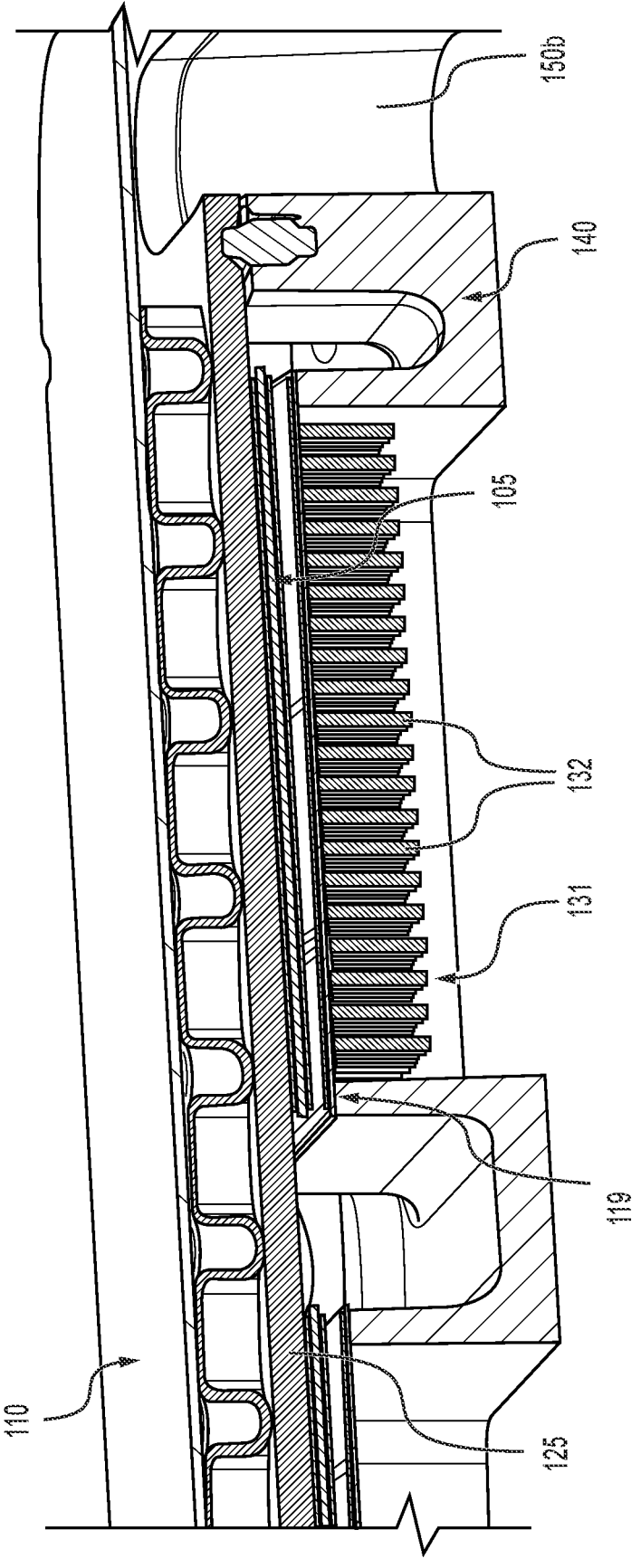
FIG. 7 depicts a cross-sectional view of an exemplary fin combined cooling system, according to one or more embodiments.

FIG. 7 depicts a cross-sectional view of an exemplary fin combined cooling system 500. Fin system 131 may include one or more fins 132 that may extend into a coolant medium, e.g., air, a refrigerant, water, oil, etc., as depicted in FIG. 7. It will be understood that although fins having a cylindrical configuration are shown, the fins may be of any applicable shape such as, for example, pin shaped, wave shaped, rectangular shaped, or oblong shaped, etc. The one or more fins 132 may be configured to have a surface area to maximize heat dissipation into the coolant medium and/or to facilitate coolant flow. The one or more fins 132 may include a first exterior surface in contact with a base plate 119 (as further described herein) such that each other exterior surface of a respective fin is a floating surface. An exterior surface may be any exposed surface of a fin (e.g., exposed to air or a coolant). A floating surface may not be mechanically or electrically connected to any other component and may be floating in free space (e.g., such that each other surface than the first surface may be configured to extend into and/or dissipate heat via contact with a coolant material). The one or more fins 132 may include any suitable materials or combination of materials, such as copper, aluminum alloys, or any other conductive material, or a combination thereof. The coolant medium may flow through fin system 131 and around the one or more fins 132.

One or more fins 132 may be mechanically adhered and/or connected directly to one or more power switches 105. For example, the fins 132 may be connected to a base plate 119, the base plate in contact with the one or more power switches 105. In another example, one or more fins 132 may be soldered, sintered, etc. directly to an individual power switch 105. In another example, the one or more fins 132 may be adhered and/or connected, e.g., soldered, sintered, etc. to a direct bond copper structure, the direct bond copper structure being disposed between the fins 132 and power switch 105. In this way, power switch 105 may be in the direct path of the coolant flow via the fins 132, to minimize its thermal resistance. Any suitable number of fins 132 may be adhered to a power switch 105, e.g., approximately 200 fins 132 per power switch 105. The number and placement of fins 132 may be optimized to ensure proper flow characteristics and sintering capability.

FIG. 8A and FIG. 8B depict exemplary fin cooling systems 800. One or more fins 132 may extend outwardly from power switch 105 into a fin housing 145, as depicted in FIG. 8A and FIG. 8B. In one embodiment, power switch 105 may be attached to or against a surface of fin housing 145, and its weight may be structurally supported, at least in part, by fin housing 145. Fin housing 145 may be modular and may include one or more modular components that may be joined (e.g., cased) together. For example, modular components of fin housing 145 may be joined in a structural carrier such as a die cast, which may be sealed or welded to the main housing.

Figure 9:
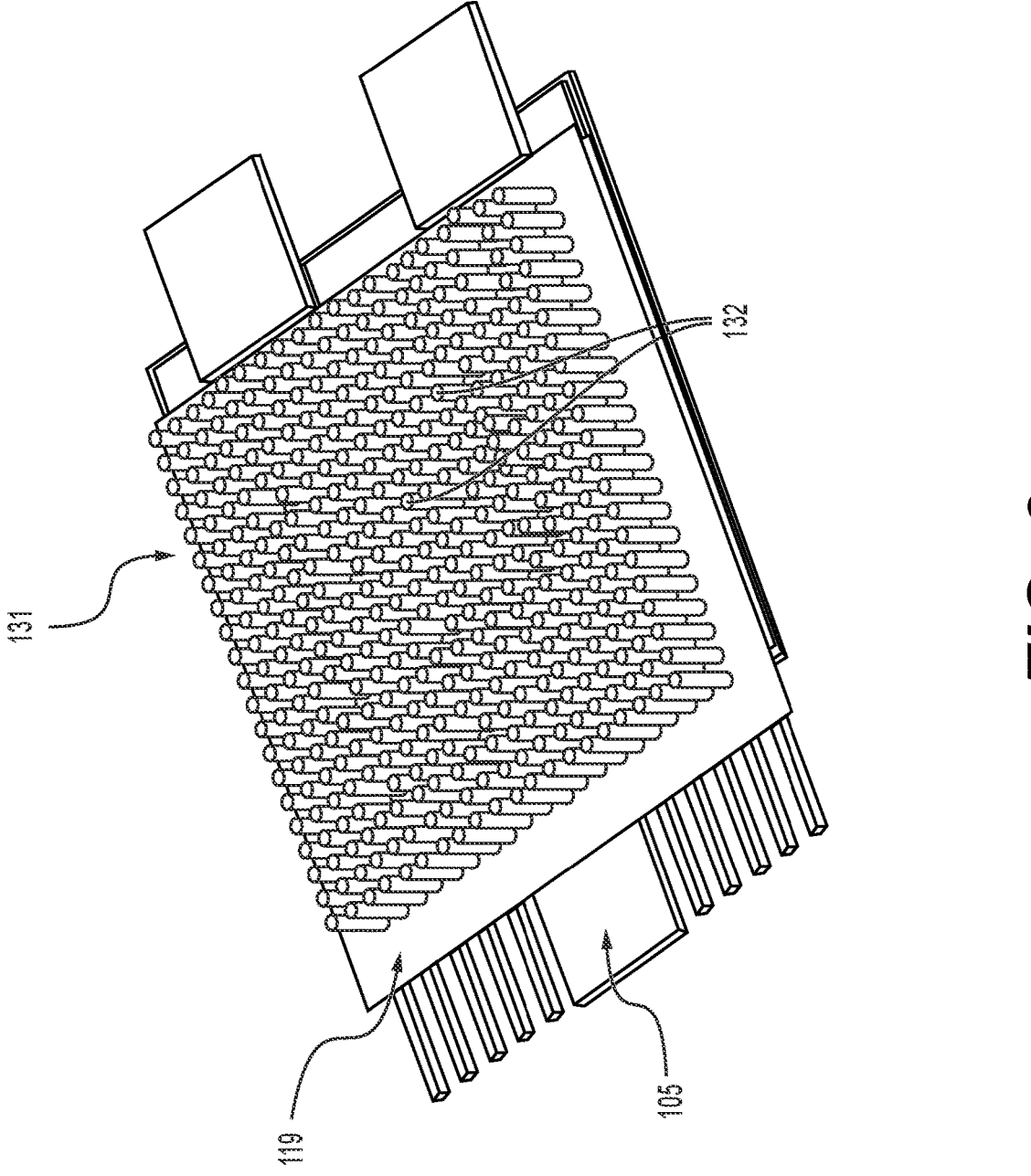
FIG. 9 depicts an internal view of an exemplary fin combined cooling system, according to one or more embodiments.

FIG. 8A depicts a perspective view of fin housing 145 and FIG. 8B depicts a cross-sectional view of fin housing 145. In some embodiments, fin housing 145 may include a seal, in contact with one or more power switch 105. For example, the base of fin housing 145 may include the die cast, as described above, to form three walls. Base plate 119 (e.g., as shown in FIG. 9) may connect to the die cast walls to form the boundaries of fin housing 145. The power switch 105 may be positioned on the base plate 119, as depicted in FIG. 8A. The fins 132 may be connected to the base plate 119. This structure may provide thermal dissipation away from the power switch 105 while preventing fluid from leaking or escaping fin housing 145.

In some embodiments, fin housing 145 may include seals at one or more points where base plate 119 connects to fin housing 145. In some embodiments one or more seals may surround the base plate 119 connected to power switch 105 to prevent coolant from entering power switch 105. The seals may include any suitable material (e.g., high-polymer vinyl methyl polysiloxanes (silicone), rubber, neoprene, nitrile, ethylene-propylene diene monomer (EPDM), fluorocarbons, etc.) or configuration (e.g., O-ring gasket, manifold seal, labyrinth seal, etc.). One or more protrusions 142 may extend from fin housing 145 in a direction facing power switch 105 to provide friction stir welding or epoxy attachment to the casting to create a coolant seal.

FIG. 9 depicts an internal view of an exemplary fin cooling system 800. In some embodiments, the one or more fins 132 may be sealed within fin housing 145 (not shown in FIG. 9) and/or against power switch 105 (e.g., via a base plate 119), as depicted in FIG. 9. A sealing substrate may be positioned between power switch 105 and base plate 119 and may include of one or more plates or sheets of sealing materials, such as silicone, neoprene, EPDM, etc.

The use of fin system 131, as disclosed herein, in lieu of a heat sink (e.g., a single or a dual heat sink configuration), may reduce costs and complexity. In some embodiments, costs and complexity may be further reduced by using a passive cooling structure (e.g. a passive heat sink 115), with a fin system 131, as depicted in FIG. 8A and FIG. 8B. An active and passive combination cooling system including, e.g., passive heat sink 115 and fin system 131, may provide an even lower cost per product, as well as a reduced risk of leaks. Additionally, passive heat sink 115 may further provide additional structural stability and/or dispersion of force across a given structure, as discussed herein.

While cooling systems are generally discussed herein with passive heat sink 115 or active heat sink 110 opposite fin system 131, it should be understood that the components may be in any suitable configuration. For example, in some embodiments, passive heat sink 115 or active heat sink 110 may be configured to on the opposite side of power switch 105 than discussed above (e.g., such that fin system 131 and passive heat sink 115 or active heat sink 110 are swapped). In another example, the device may be configured to such that the components may be in a vertical or angled orientation.

FIG. 10 depicts a flowchart for dissipating heat using a passive heat dissipation element and an active heat dissipation element, as discussed herein. At step 1002, heat may be generated at an electrical component such as power switch 105. The heat may be generated based on use of the electrical component (e.g., to convert power, to generate power or signals, to transfer power or signals, etc.). At step 1004, the at least a portion of the heat generated at the electrical component may be dissipated to a passive heat dissipation element (e.g., passive heat sink 115). The heat may be dissipated via TIM and/or other thermal connection of the electrical component with the passive heat dissipation element. As disclosed herein, a passive heat dissipation element may not include a fluid passage and/or may not provide other coolant based dissipation. The passive heat dissipation element may be shaped such that each surface of the passive heat dissipation element terminates in free space, as discussed herein.

At step 1006, at least a portion of the heat received at the passive heat dissipation element may be further dissipated to an active heat dissipation element (e.g., active heat sink 110). The heat may be dissipated from the passive heat dissipation element to the active heat dissipation element in accordance with the techniques disclosed herein. At step 1008, at least a portion of the heat received at the active heat dissipation element may be further dissipated via a fluid. The fluid may be flow through a fluid passage of the active heat dissipation element.

Figure 11:
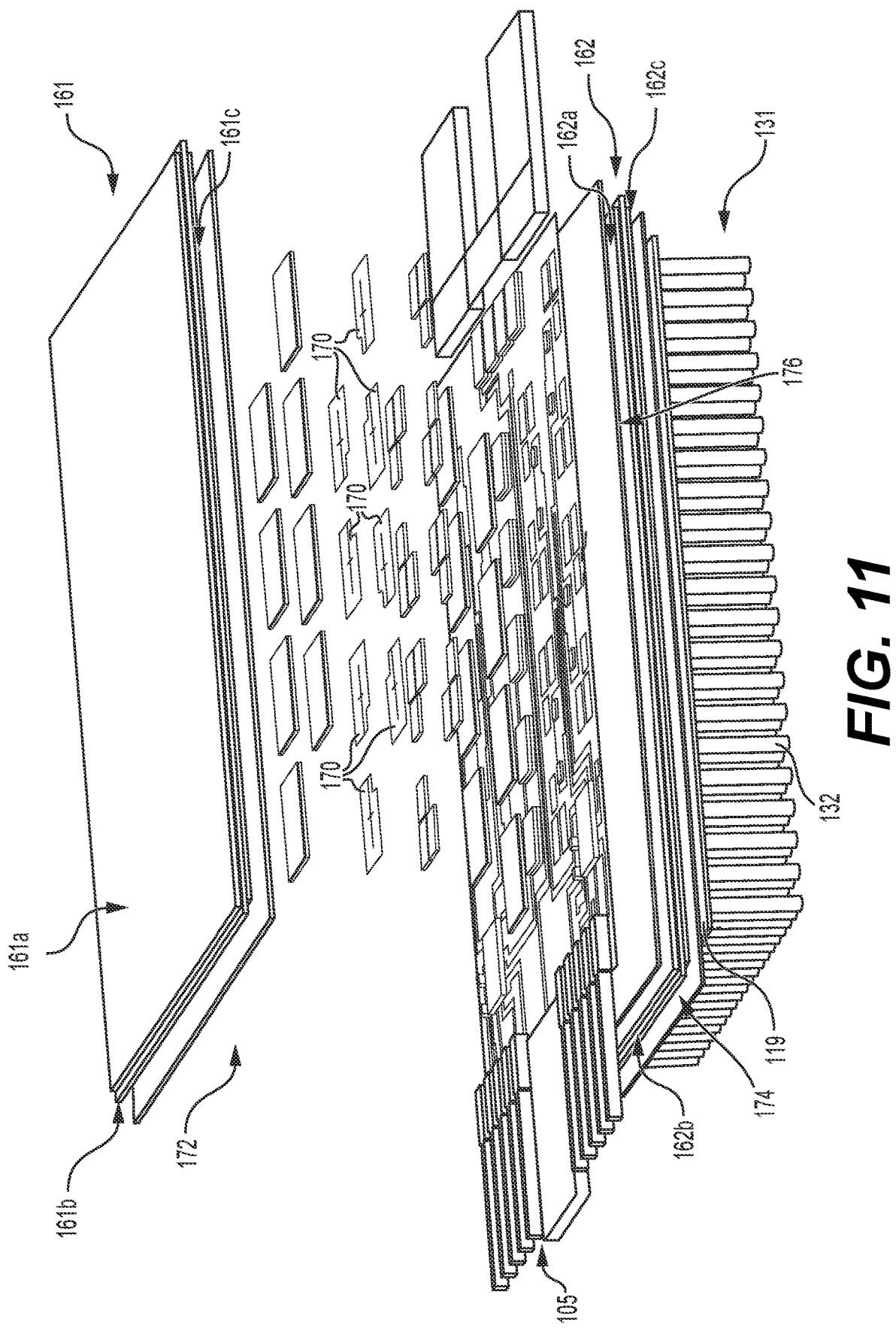
FIG. 11 depicts a schematic diagram for connecting a cooling structure to an electrical component, according to one or more embodiments.

FIG. 11 depicts a technique for connecting (e.g., sintering and/or soldering) a cooling structure to one or more power switches 105. In various embodiments, as disclosed herein, one or more power module components or devices may be configured for double-sided active cooling (e.g., using two active heat sinks 110), active and passive cooling (e.g., using an active heat sink 110 and a passive heat sink 115), or single-sided cooling (e.g., using only an active heat sink 110), as disclosed herein. A sinter-to-base and/or sinter-on-top process may be implemented to connect a power switch to one or more cooling structures, as further discussed herein. A full assembly (e.g., a power switch 105 assembly and one or more cooling structures) may be dropped-in to a lower casting (e.g., base plate 140, as shown in FIG. 7). The full assembly may be adhered to the lower casting (e.g., base plate 140). Alternatively, or in addition, the full assembly or a portion thereof may be connected to a casting in any applicable manner such as friction stir welding, epoxy attachment, etc. of the full assembly or a portion thereof to a casting. The full assembly may be connected to the casting with TIM, one or more seals 121, or any other applicable technique. Such connection (e.g., via sintering or soldering) may provide improved thermal resistance for one or more power switches 105.

Figure 12:
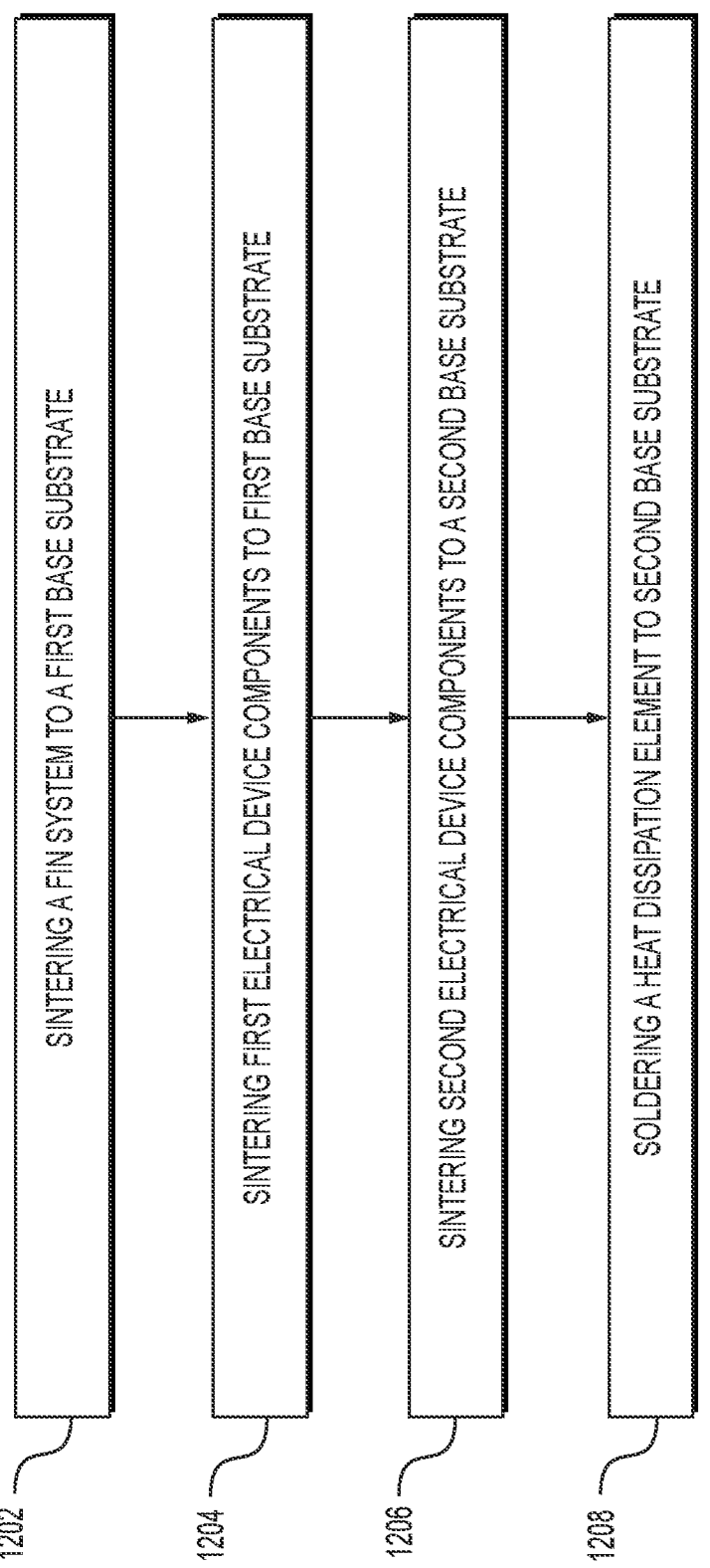
FIG. 12 depicts a flowchart for connecting a cooling structure to an electrical component, according to one or more embodiments.

As shown in FIG. 11, a base substrate 162 may include a top substrate 162a, a connection material 162b (e.g., silicon nitride (SiN)), and a bottom substrate 162c. Top substrate 162a and bottom substrate 162c may be formed of a conductive material such as copper, double bonded copper (DBC), etc. Connection material 162b may be sandwiched between top substrate 162a and bottom substrate 162c and may be thermodynamically stable. FIG. 12 depicts a flowchart including steps for the technique for connecting (e.g., sintering or soldering) one or more cooling structures to one or more power switches 105, as shown in FIG. 11. At step 1202, base plate 119 of fin system 131 may be sintered to base substrate 162. Base plate 119 may be sintered to base substrate 162 at one or more points such that base plate 119 is sealingly secured to base substrate 162. Base plate 119 may be sintered to base substrate 162 via a sintering layer 174 (e.g., a sintering film, segmented sintering films, sintering strips, sintering portions, etc.).

At step 1204 of FIG. 12, one or more components associated with power switch 105 (e.g., drains, die, lead frames, etc.) may be sintered or welded to top substrate 162a of base substrate 162 and/or to one or more other components of power switch 105. The one or more components associated with power switch 105 may be sintered to top substrate 162a of base substrate 162 via sintering layer 176 (e.g., a sintering film, segmented sintering films, sintering strips, sintering portions, etc.). For example, one or more power switch 105 drains and/or a power switch 105 lower lead frame may be sintered to base substrate 162 at one or more points via sintering layer 176. According to another example, power switch 105 die may be sintered to power switch 105 lower lead frame and power switch 105 lower lead frame and/or one or more power switch 105 drains may be sintered onto base substrate 162 via sintering layer 176.

As shown in FIG. 11, a base substrate 161 may include a top substrate 161a, a connection material 161b (e.g., SiN), and a bottom substrate 161c. Top substrate 161a and bottom substrate 161c may be formed of a conductive material such as copper, double bonded copper (DBC), etc. Connection material 161b may be sandwiched between top substrate 161a and bottom substrate 161c and may be thermodynamically stable. At step 1206 of FIG. 12, one or more components associated with power switch 105 (e.g., field transistor sources, lead frames, board, die, electrical components, electrical traces etc.) may be sintered to bottom substrate 161c of base substrate 161. The one or more components associated with power switch 105 may be sintered to bottom substrate 161c of base substrate 161 via sintering layer 172 (e.g., a sintering film, segmented sintering films, sintering strips, sintering portions, etc.). For example, a power switch 105 field transistor source and/or upper lead frame may be sintered to base substrate 161 at one or more points via sintering layer 172. Power switch 105 components 170 such as internal gate drivers and/or decoupling capacitors may have soldered interconnections.

At step 1208 of FIG. 12, an active heat dissipation element (e.g., active heat sink 110) or passive heat dissipation element (e.g., passive heat sink 115) may be connected to base substrate 161 via any applicable manner including, but not limited to, via soldering or via a TIM. In accordance with the techniques of FIG. 11 and FIG. 12, one or more internal soldering of a Silicon Carbide (SiC) die may not be required. Accordingly, the base substrate 161 may be soldered to an active heat dissipation element (e.g., active heat sink 110) or passive heat dissipation element (e.g., passive heat sink 115) without the use of TIM.

According to an embodiment, a robotic system may automatically perform the techniques disclosed in FIG. 11 and FIG. 12. The robotic system may include one or more arms (e.g., having one or multiple degrees of motion), sensors (e.g., motion sensors, position sensors, optical sensors, force sensors, pressure sensors, electrical sensors, etc.), sintering components, soldering components, pick-and-place components, movement mechanisms (e.g., a gantry, a roller, a motor, a joint, etc.), or the like. The robotic system may perform all or some of the techniques disclosed in FIG. 11 and FIG. 12 in response to and/or using a computer program (e.g., via a processor), one or more signals (e.g., sensor signals), a memory, a processor, etc.

According to an embodiment, one or more fins (e.g., fins 132) may be attached to individual power switches 105 via base plate 119, and the one or more fins or corresponding fin system 131 may be separately tested to aid First Time Quality (FTQ). FTQ may be a metric used to measure how easily a given assembly may be manufactured. According to an embodiment, fin system 131 and base plate 119 may be sealingly attached to power switch 105 and/or base plate 140 or other casting via any applicable manner such as an adhesive, an epoxy attachment, and/or friction stir welding, to create a coolant seal.

The connected power switch 105 and fin system 131, connected via the techniques described in FIG. 11 and FIG. 12 may be dropped into a casting (e.g., base plate 140) as discussed herein. Such a configuration may result in an overall height reduction and/or improved sealing of the cooling channel created via fin system 131. Over-molding of an assembly may be performed after a switch assembly is completed or as an entire assembly is configured in accordance with the techniques described in FIG. 11 and FIG. 12.

Other embodiments of the disclosure will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method for mounting a fin system in a power module, the method comprising:
   sintering an active heat dissipation fin system to a base plate, wherein the active heat dissipation fin system is configured to be in direct contact with coolant and dissipate heat either directly from a first power switch or a second power switch or from a passive heat dissipation element, the active heat dissipation fin system comprising a plurality of fins attached to and extending away from the base plate;
   sintering the base plate to a first base substrate to seal and secure the first base substrate to the base plate;
   sintering a first power switch component to the first base substrate;
   sintering a second power switch component to a second base substrate;
   soldering the passive heat dissipation element to the second base substrate, wherein no coolant directly contacts the passive heat dissipation element, and
   sealing a full assembly, including the active heat dissipation fin system, the base plate, the first power switch, the second power switch, and the passive heat dissipation element, to a casting, with the active heat dissipation fin system within the casting to sealingly isolate the active heat dissipation fin system from the first power switch and the second power switch.

2. The method of claim 1, wherein at least one of the first base substrate or the second base substrate comprise a top substrate, a connection material, and a bottom substrate.

3. The method of claim 1, wherein the fin system is sintered to the first base substrate via a first sintering layer, the first power switch component is sintered to the first base substrate via a second sintering layer, and the second power switch component is sintered to the second base substrate via a third sintering layer.

4. The method of claim 1, wherein each exterior surface of each of the plurality of fins includes a first exterior surface and a plurality of other exterior surfaces, the first exterior surface being attached to the base plate and the plurality of other exterior surfaces being floating surfaces.

5. The method of claim 1, further comprising attaching the fin system sintered to the first base substrate, the first power switch component sintered to the first base substrate, the second power switch component sintered to the second base substrate, and the active heat dissipation element soldered to the second base substrate.

6. The method of claim 5, wherein the attaching comprises at least one of applying an adhesive, applying an epoxy attachment, applying an elastomeric sealing, or friction stir welding.

7. The method of claim 1, further comprising:

activating a power switch comprising the first power switch component and the second power switch component; and dissipating heat generated in response to activating the power switch to the fin system.

8. The method of claim 7, further comprising:

causing coolant to flow through a coolant passage comprising the plurality of fins; and dissipating a portion of the heat received at the active heat dissipation element to the coolant.

9. The method of claim 1, further comprising:

activating a power switch comprising the first power switch component and the second power switch component; and dissipating heat generated in response to activating the power switch to the passive heat dissipation element or the active dissipation element.

10. The method of claim 1, further comprising applying a fluid seal to sealingly isolate the plurality of fins from at least one of the first power switch component or the second power switch component.

11. The method of claim 1, wherein at least one of the first power switch component or the second power switch component is at least one of a lead frame or a die.

* * * * *